(12) United States Patent
Stecher

(10) Patent No.: US 10,002,830 B2
(45) Date of Patent: Jun. 19, 2018

(54) SEMICONDUCTOR DEVICE WITH MULTI-LAYER METALLIZATION

(71) Applicant: Infineon Technologies AG, Neubiberg (DE)

(72) Inventor: Matthias Stecher, Munich (DE)

(73) Assignee: Infineon Technologies AG, Neubiberg (DE)

(*) Notice: Subject to any disclaimer, the term of this patent is extended or adjusted under 35 U.S.C. 154(b) by 0 days. days.

(21) Appl. No.: 15/054,318

(22) Filed: Feb. 26, 2016

(65) Prior Publication Data

US 2016/0181154 A1    Jun. 23, 2016

Related U.S. Application Data

(62) Division of application No. 11/859,799, filed on Sep. 24, 2007.

(51) Int. Cl.
| | |
|---|---|
| *H01L 23/528* | (2006.01) |
| *H01L 21/768* | (2006.01) |
| *H01L 23/522* | (2006.01) |
| *H01L 21/288* | (2006.01) |
| *H01L 21/3205* | (2006.01) |
| *H01L 23/532* | (2006.01) |

(52) U.S. Cl.
CPC ...... *H01L 23/5283* (2013.01); *H01L 21/2885* (2013.01); *H01L 21/32051* (2013.01); *H01L 21/7685* (2013.01); *H01L 21/76807* (2013.01); *H01L 21/76838* (2013.01); *H01L 21/76852* (2013.01); *H01L 21/76871* (2013.01); *H01L 21/76873* (2013.01); *H01L 21/76885* (2013.01); *H01L 23/5226* (2013.01); *H01L 23/53238* (2013.01); *H01L 21/76879* (2013.01); *H01L 23/53223* (2013.01); *H01L 23/53252* (2013.01); *H01L 2924/0002* (2013.01)

(58) Field of Classification Search
CPC ......... H01L 21/76871; H01L 21/76807; H01L 23/5226; H01L 23/5283
See application file for complete search history.

(56) References Cited

U.S. PATENT DOCUMENTS

| | | | | |
|---|---|---|---|---|
| 5,872,399 | A * | 2/1999 | Lee | H01L 23/49816 257/668 |
| 5,929,524 | A * | 7/1999 | Drynan | H01L 21/76816 257/758 |
| 6,159,837 | A * | 12/2000 | Yamaji | H01L 24/11 257/E21.508 |
| 6,255,732 | B1 * | 7/2001 | Yokoyama | H01L 23/5329 257/760 |
| 6,486,559 | B1 * | 11/2002 | Ueno | H01L 21/3146 257/40 |
| 6,531,734 | B1 * | 3/2003 | Wu | H01L 21/28273 257/315 |
| 6,756,678 | B2 * | 6/2004 | Chopra | H01L 21/76849 257/758 |

(Continued)

*Primary Examiner* — Julio J Maldonado
*Assistant Examiner* — Abbigale Boyle
(74) *Attorney, Agent, or Firm* — Viering, Jentschura & Partner mbB

(57) ABSTRACT

One or more embodiments are related to a semiconductor device, comprising: a metallization layer comprising a plurality of portions, each of the portions having a different thickness. The metallization layer may be a final metal layer.

17 Claims, 21 Drawing Sheets

(56) References Cited

U.S. PATENT DOCUMENTS

| | | | |
|---|---|---|---|
| 7,132,736 B2* | 11/2006 | Bakir | H01L 24/13 |
| | | | 174/250 |
| 7,902,660 B1* | 3/2011 | Lee | H01L 21/4857 |
| | | | 257/698 |
| 2002/0084526 A1* | 7/2002 | Kasai | H01L 21/76802 |
| | | | 257/758 |
| 2003/0003617 A1* | 1/2003 | Ikeda | H01L 23/5256 |
| | | | 438/37 |
| 2003/0073251 A1* | 4/2003 | Ning | H01L 27/222 |
| | | | 438/3 |
| 2003/0116852 A1* | 6/2003 | Watanabe | H01L 21/76801 |
| | | | 257/758 |
| 2004/0150070 A1 | 8/2004 | Okada et al. | |
| 2004/0197979 A1* | 10/2004 | Jeong | B23K 3/0607 |
| | | | 438/202 |
| 2005/0029677 A1* | 2/2005 | Huang | H01L 24/10 |
| | | | 257/780 |
| 2005/0087885 A1* | 4/2005 | Jeong | H01L 23/49811 |
| | | | 257/778 |
| 2007/0045812 A1* | 3/2007 | Heng | H01L 24/81 |
| | | | 257/693 |
| 2007/0187760 A1* | 8/2007 | Furuta | H01L 29/41733 |
| | | | 257/347 |

* cited by examiner

SEMICONDUCTOR DEVICE WITH MULTI-LAYER METALLIZATION

RELATED APPLICATION(S)

This is a divisional of U.S. patent application Ser. No. 11/859,799, filed on Sep. 24, 2007, entitled "Semiconductor Device with Multi-Layer Metallization", which is hereby incorporated herein by reference in its entirety.

FIELD OF THE INVENTION

Generally, the present invention relates to semiconductor devices and methods of making semiconductor devices. More particularly, the present invention relates to metallization technology.

BACKGROUND OF THE INVENTION

Chips in certain technologies may include electronic devices and circuits that may require final or top metal lines having a relatively large thickness. However, the same chip may also include electronic devices and circuits may require final or top metal lines with a relatively fine pitch.

SUMMARY OF THE INVENTION

An embodiment of the invention is a semiconductor device, comprising: a metallization layer comprising at least a first metal line and a second metal line spacedly disposed from the first metal line, the first metal line having a first thickness, the second metal line having a second thickness greater than the first thickness. In one or more embodiments, the metallization layer may be a final metal layer.

An embodiment of the invention is a semiconductor device, comprising: a metallization layer comprising a plurality of portions, each of the portions having a different thickness. In one or more embodiments, the metallization layer may be a final metal layer.

An embodiment of the invention is a semiconductor structure, comprising: a metal layer comprising at least one metal line, the metal line comprising a plurality of portions, each of the portions having a different thickness. In one or more embodiments, the metal layer may be a final metal layer and the metal line may be a final metal line.

An embodiment of the invention is a method for forming a final metal layer of semiconductor device, comprising: providing a surface; forming a first metal layer over a portion of the surface; and forming a second metal layer over at least a portion of the first metal layer and/or over a portion of the surface that is not occupied by the first metal layer.

An embodiment of the invention is a method for forming a semiconductor device, comprising: providing a metal seed layer; first electroplating a first metal layer over the metal seen layer; and second electroplating a second metal layer over the first metal layer.

BRIEF DESCRIPTION OF THE DRAWINGS

FIGS. 11 through 13A provide an embodiment of a method of further processing the semiconductor device from FIG. 10.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
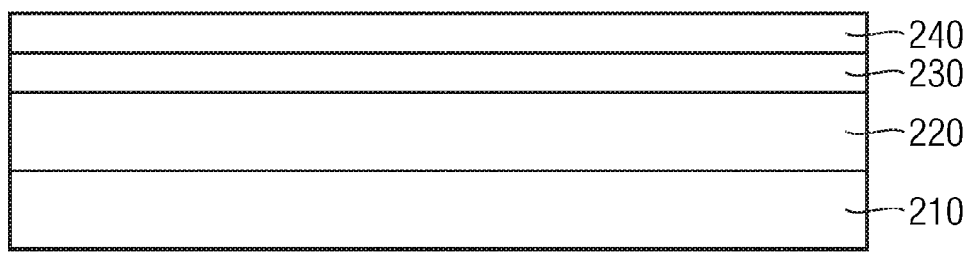
FIGS. 1 through 10 provide an embodiment of a method of making an embodiment of a semiconductor device.

FIGS. 1 through 10 provide an embodiment of a method of making an embodiment of a semiconductor device. FIG. 1 shows a semiconductor structure 100 of an embodiment of a partially completed semiconductor chip or device. The structure 100 comprises a substrate 210. In one or more embodiments of the invention, the substrate 210 may be a p-type substrate. However, more generally, in one or more embodiments of the invention, the substrate may be a silicon substrate or other suitable substrate. The substrate may be a silicon-on-insulator (SOI) substrate. The SOI substrate may, for example, be formed by a SIMOX process. The substrate may be a silicon-on-sapphire (SOS) substrate. The substrate may be a silicon-on-germanium substrate.

Formed over the substrate 210 is a layer 220. The layer 220 may itself comprise one or more levels of metallization layers, inter-level dielectric layers, vias, plugs etc. The combination of the layer 210 and layer 220 may be viewed as a workpiece or a support structure for the deposition of additional layers over such a workpiece or support. In one or more embodiments, a top portion of the layer 220 may comprise an inter-level dielectric layer having vias and plugs.

Referring to FIG. 1, a barrier layer 230 may be formed over the layer 220. The barrier layer 230 may comprise a conductive material. The barrier layer 230 may comprise a metallic material. The barrier layer 230 may comprise one or more of the elements from the group consisting of Ti, Ta, N and W. The barrier layer 230 may comprise a Ti-based material or a Ta-based material. The barrier layer 230 may comprise one or more materials selected from the group consisting of TiW, WN, TiN, and TaN. The barrier layer may be formed as a composite or as a dual-layered system such as a titanium/TiN or a tantalum/TaN dual-layer. The barrier layer 230 may serve to lower or prevent diffusion between the materials that are on opposites sides of the barrier layer. The barrier layer 230 may be deposited by a chemical vapor deposition (CVD) or a physical vapor deposition (PVD) process.

Again referring to FIG. 1, a metal seed layer 240 may be formed over the barrier layer 230. The metal seed layer 240 may be formed by a sputtering process or by a chemical vapor deposition (CVD) process. In one or more embodiments, the thickness of the metal seed layer may be about 5000 angstroms or less. In another embodiment, the thickness may be about 2000 angstroms or less. In another embodiment, the thickness may be about 1000 angstroms or less.

Figure 2:
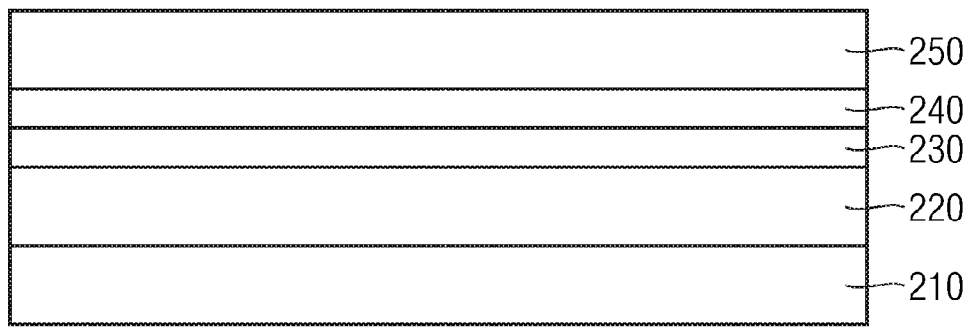
Figure 3:
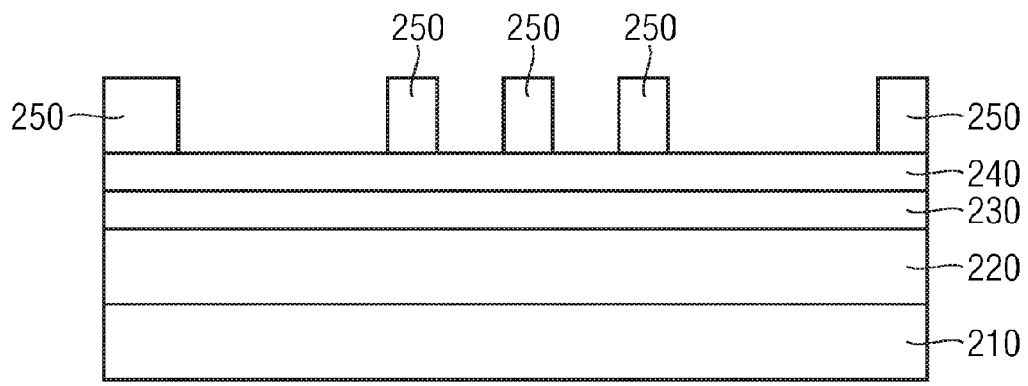

Referring to FIG. 2, a galvanic resist 250 may be formed over the metal seed layer 240. The galvanic resist 250 may be applied by a spin on process. Suitable galvanic resists are available commercially. Referring to FIG. 3, the galvanic resist 250 may be patterned and a portion may be removed from particular locations over the metal seed layer 240.

Figure 4:
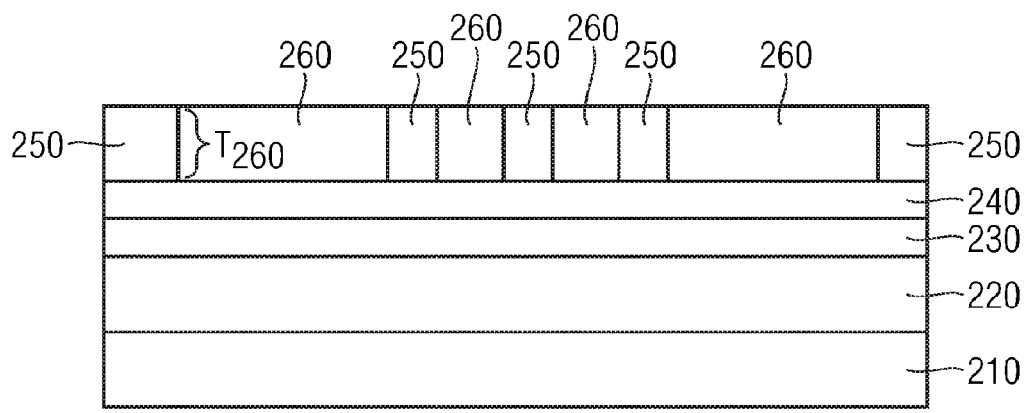

Referring to FIG. 4, a first metal layer 260 may be deposited over the metal seed layer in places where the portions of galvanic resist were removed. Generally, the thickness of the first metal layer 260 is not limited to any particular thickness. In one or more embodiments, the first metal layer 260 may have a thickness of about 2000 nm or less. In one or more embodiments, the first metal layer 260 may have a thickness of about 1000 nm (1000 nanometers) or less. In one or more embodiments, the first metal layer 260 may have a thickness of about 500 nm or less. In one or more embodiments, the first metal layer 260 may have a thickness of about 250 nm or less. In one or more embodiments, the first metal layer 260 may have a thickness of about 200 nm or less. In one or more embodiments, the first metal layer 260 may have a thickness of about 150 nm or less. The thickness of the first metal layer 260 is shown as thickness $T_{260}$ in FIG. 4.

The first metal layer 260 may be formed by an electroplating process. As a possible example of an electroplating process, pure copper may be electroplated by placing a wafer (which may, for example, have a layered arrangement similar to that shown in FIG. 3) into a solution of, for example, copper sulfate containing copper ions. The wafer (with a seed layer) may be electrically coupled to a power supply to form a cathode. A solid piece of pure copper may be placed in the solution and electrically coupled to the power supply to form an anode. At the cathode, copper ions are reduced to metallic copper. At the anode, the pure copper is oxidized. Other electroplating processes are, of course, possible. In other embodiments, other metallic materials (such a copper alloys) may be electroplated.

In the embodiment shown in FIG. 4, the first metal layer 260 is formed at about the height of the galvanic resist 250. However, in one or more embodiments, the first metal layer may be formed to a height which is below the height of the galvanic resist. In one or more embodiments, the first metal layer 260 may be formed to a height which is above the height of the galvanic resist 250.

Figure 5:
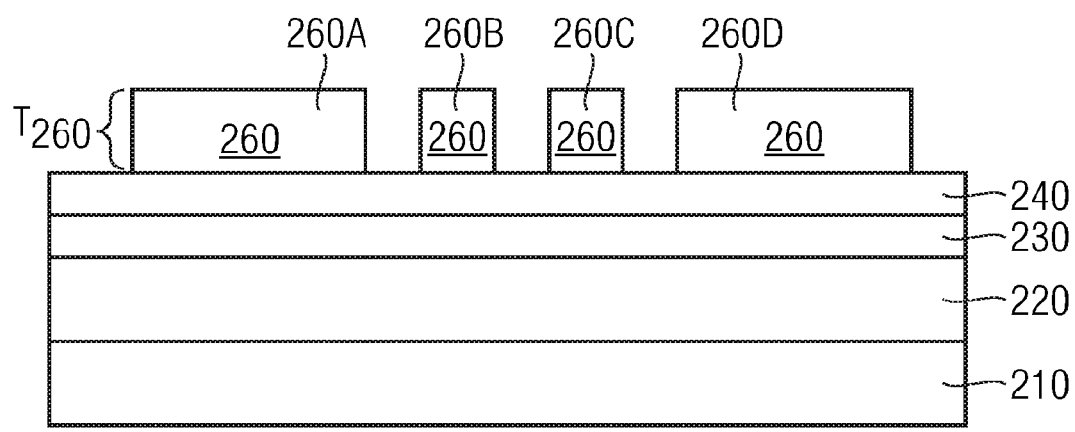

Referring to FIG. 5, after the first metal layer 260 is formed, the remaining galvanic resist 250 may be removed. Referring to FIG. 5, it is seen that a first metal layer 260 may be formed which comprises four spacedly disposed first metal layer portions 260A-D of the first metal layer 260. In one or more embodiments, a first metal layer 260 may be formed which comprises only a single continuous portion. In one or more embodiments, a first metal layer 260 may be formed which includes a plurality of spacedly disposed portions. In one or more embodiments, two or more first metal layer portions may have a distance between them which is less than about 600 nm. In another embodiment, the first metal layer portions may have a distance between them which is less than about 500 nm. As an example, the first metal layer portions may have a distance between them which is about 400 nm. The thickness of first metal layer 260 is also shown as thickness $T_{260}$ in FIG. 5. Each of the spacedly disposed portions 260A-D may be viewed as a separate metal line.

Figure 6:
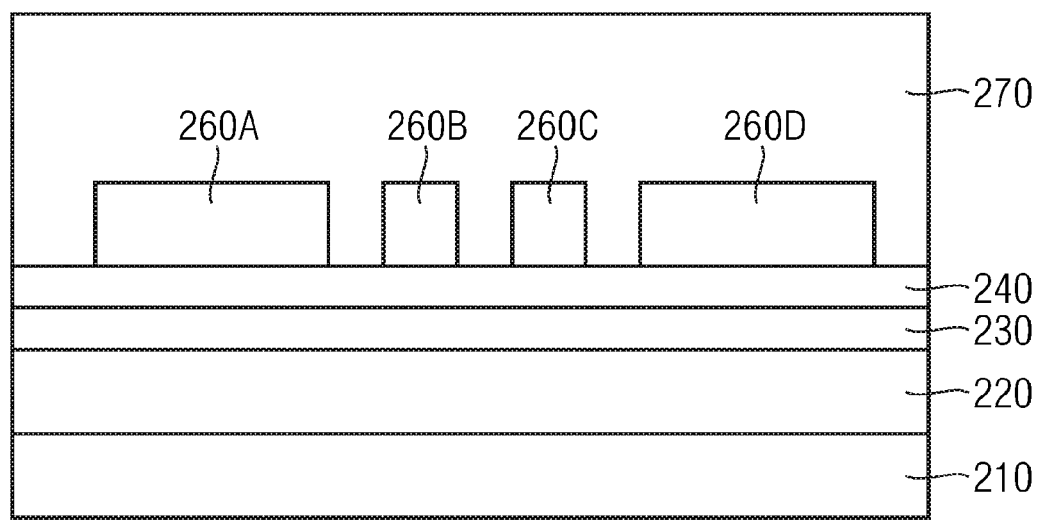
Figure 7:
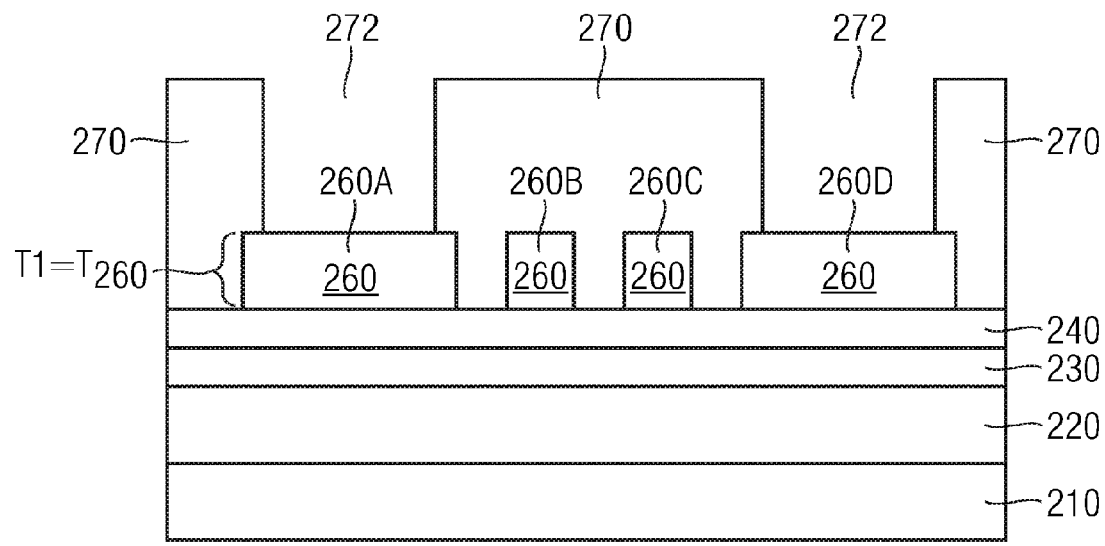

Referring to FIG. 6, a second layer of galvanic resist 270 may be formed over the structure from FIG. 5. Referring to FIG. 6, the galvanic resist 270 may then be patterned (where portions of the galvanic resist are removed) to form the structure shown in FIG. 7. Referring to FIG. 7, it is seen that portions of the galvanic resist 270 have been removed so that openings 272 are formed overlying top surfaces of the first metal layer 260 where a second metal layer will be deposited. In particular, it is seen that openings 272 are formed so as to expose at least a portion of the top surface of each of the first metal layer portions 260A and 260D. The first metal layer portions 260B and 260C are left covered by the galvanic resist.

Figure 8:
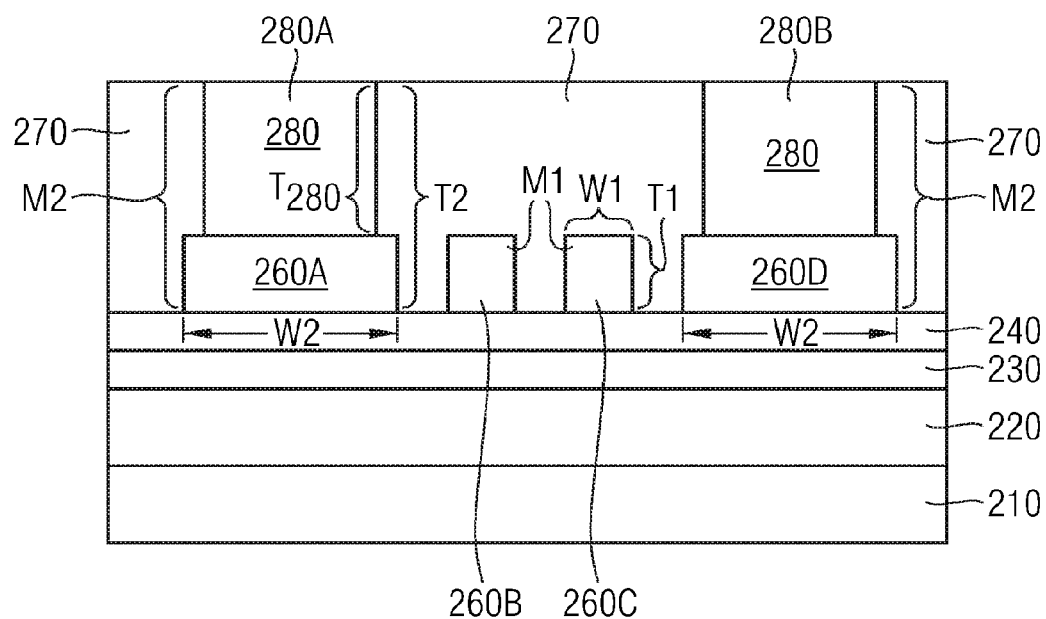

Referring to FIG. 8, a second metal layer 280 may then be deposited within the openings 272 formed in the galvanic resist. In the embodiment shown, the second metal layer 280 is disposed over and in electrical contact with the first metal layer portion 260A and the first metal layer portion 260D. The deposition of the second metal layer 280 may be formed using an electroplating process. In the embodiment shown, the height of the second metal layer 280 is level with the height of the resist 270. However, in other embodiments it is possible that the second metal layer 280 is deposited below the top surface of the resist 270 or that is it deposited above the top surface of the resist 270.

In one or more embodiments, the thickness of the second metal layer 280 (shown as thickness $T_{280}$ is FIG. 8) may be greater than the thickness $T_{260}$ of the first metal layer 260. In one or more embodiments, the thickness of the second metal layer 280 may be less than the thickness of the first metal layer 260. In one or more embodiments, the thickness of the second metal layer 280 may be about the same as the thickness of the first metal layer 260.

In one or more embodiments, the thickness $T_{280}$ of the second metal layer 280 may be at least 2 times as large as the thickness of the first metal layer 260. In one or more embodiments, the thickness of the second metal layer 280 may be at least 5 times as large as the thickness of the first metal layer 260. In one or more embodiments, the thickness of the second metal layer 280 may be at least 10 times as large as the thickness of the first metal layer 260. In one or more embodiments, the thickness of the second metal layer 280 may be at least times as large as the thickness of the first metal layer 260. In one or more embodiments, the thickness of the second metal layer 280 may be at least 100 times as large as the thickness of the first metal layer 260.

In one or more embodiments, the thickness of the second metal layer 280 may be about 1000 nm or greater. In one or more embodiments, the thickness of the second metal layer may be about 1500 nm or greater. In one or more embodiments, the thickness of the second metal layer 280 may be about 2000 nm or greater. In one or more embodiments, the thickness of the second metal layer may be about 2500 nm or greater. In one or more embodiments, the thickness of the second metal layer 280 may be about 3000 nm or greater. In one or more embodiments, the thickness of the second metal layer may be about 5000 nm or greater. In one or more embodiments, the thickness of the second metal layer may be about 10000 nm or greater. In one or more embodiments, the thickness of the second metal layer may be about 20000 nm or greater.

In the embodiment shown FIG. 8, the second metal layer 280 is deposited over the two spacedly disposed first metal layer portions 260A,D to form two metal lines M2 having a thickness T2. As shown, a portion 280A of the second metal layer 280 is deposited over the portion 260A of first metal layer 260 to form a first metal line M2. Likewise, a portion 280B of the second metal layer 280 is deposited over the portion 260B of first metal layer 260 for form a second metal line M2. The remaining two first metal layer portions 260B,C form metal lines M1 having a thickness T1 which is equal to the thickness $T_{260}$ of the first metal layer. The thickness T2 of metal lines M2 is greater than the thickness T1 of metal lines M1. Hence, two groups of metal lines are formed. A first group of metal lines are the metal lines M1. These metal lines include the first metal layer 260 but not the second metal layer 280. A second group of metal lines are the metal lines M2. These metal lines include the first metal layer 260 and the second metal layer 280. In the embodiment shown, the metal lines M2 are thicker than the metal lines M1.

In an embodiment of the invention, there may be at least one thicker metal line and at least one thinner metal line (where a thicker metal line is thicker than a thinner metal line). In an embodiment of the invention, there may be a plurality of thicker metal lines. In an embodiment of the invention, there may be a plurality of thinner metal lines.

In one or more embodiments, the metal lines M1 may have a thickness T1 of about 2000 nm or less. In one or more embodiments, the thickness T1 may be about 1000 nm or less. In one or more embodiments, the thickness T1 may be about 500 nm or less. In one or more embodiments, the thickness T1 may be about 250 nm or less. In one or more embodiments, the thickness T1 may be about 200 nm or less. In one or more embodiments, the thickness T1 may be about 150 nm or less.

In one or more embodiments, the metal lines M2 may have a thickness T2 of about 500 nm or greater. In one or more embodiments, the metal lines M2 may have a thickness T2 of about 1000 nm or greater. In one or more embodiments, the thickness T2 may be about 1500 nm or greater. In one or more embodiments, the thickness T2 may be about 2000 nm or greater. In one or more embodiments, the thickness T2 may be about 2500 nm or greater. In one or more embodiments, the thickness T2 may be about 3000 nm or greater. In one or more embodiments, the thickness T2 may be about 5000 nm or greater. In one or more embodiments, the thickness T2 may be about 10000 nm or greater. In one or more embodiments, the thickness T2 may be about 20000 nm or greater.

In one or more embodiments, the thickness T2 of the metal lines M2 may greater than the thickness T1 of the metal lines M1. In one or more embodiments, the thickness T2 may be at least 2 times as large as the thickness T1. In one or more embodiments, the thickness T2 may be at least 5 times as large as the thickness T1. In one or more embodiments, the thickness T2 may be at least 10 times as large as the thickness T1. In one or more embodiments, the thickness T2 may be at least 20 times as large as the thickness T1. In one or more embodiments, the thickness T2 may be at least 50 times as large as the thickness T1. In one or more embodiments, the thickness T2 may be at least 100 times as large as the thickness T1.

Referring to FIG. 8, each of the metal lines M1 have a width W1 while each of the metal lines M2 have a width W2. In the embodiment shown, the width W2 of the thicker lines M2 is greater than the width W1 of the thinner lines M1 (so that W2>W1). However, this does not have to be the case so that it is also possible that the thicker lines M2 have a smaller width that the thinner lines M1 (so that W2<W1). It is also possible that the thinner lines M1 and the thicker lines M2 have the same width (so that W1=W2). Likewise, it is possible that the thicker lines M2 may each have a different width and/or the thinner lines M1 may each have a different width.

In the embodiment shown in FIG. 8, the distance between the two metal lines M1 is less than the distance between the two metal lines M2. However, this does not have to be the case. In one or more embodiments, the thinner metal lines M1 may have a finer pitch than the thicker metal lines M2, but this does not have to be the case.

In one or more embodiments, the distance between metal lines M1 may be about 600 nm or less. In one or more embodiments, the distance between metal lines M1 may be about 500 nm or less. In one or more embodiments, the distance between metal lines M1 may be about 400 nm or less.

In one or more embodiments, the distance between metal lines M2 may be about 800 nm or more. In one or more embodiments, the distance between metal lines M2 may be about 1000 nm or more. In one or more embodiments, the distance between metal lines M2 may be about 1500 nm or more.

Figure 9:
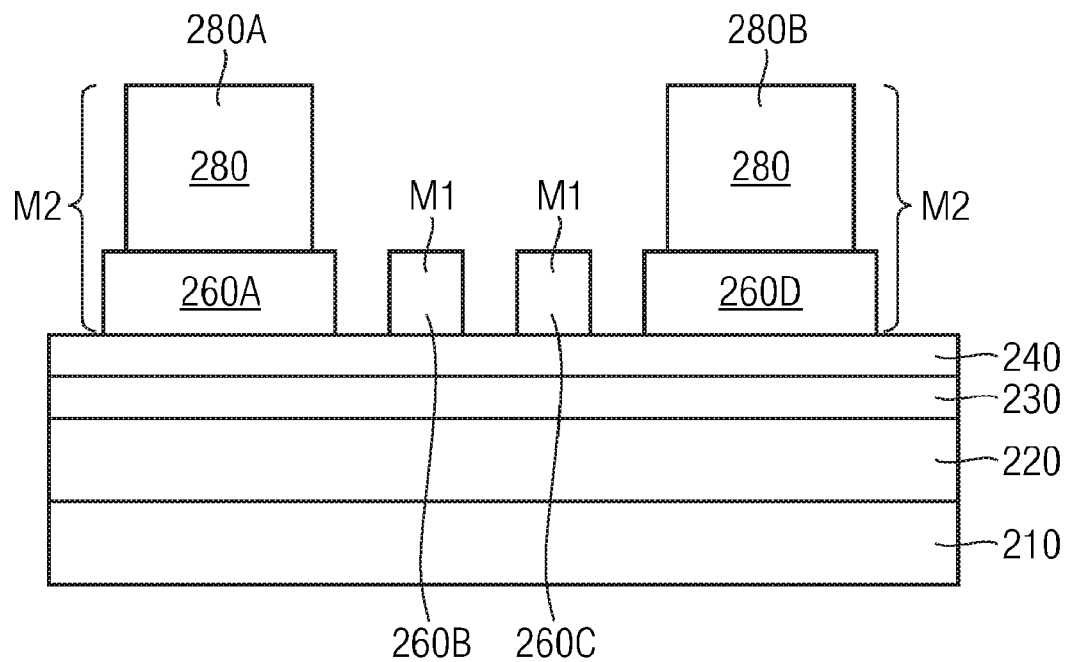
Figure 10:
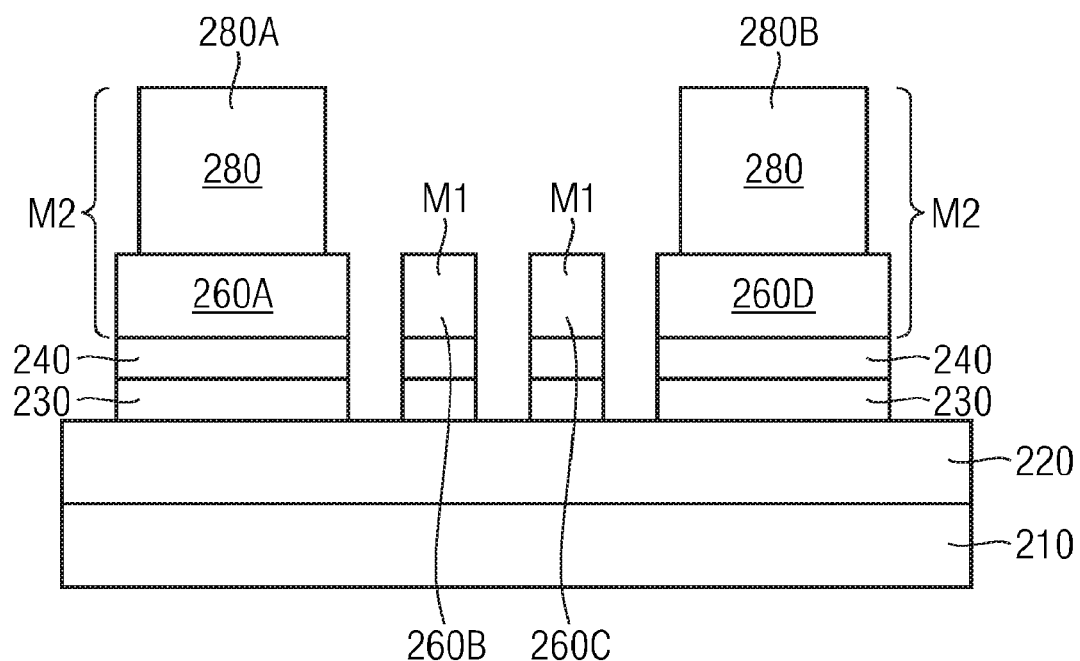

Referring to FIG. 9, after the deposition of the second metal layer 280, the remaining portion of the galvanic resist may be removed. Referring to FIG. 10, after the galvanic resist is removed, in one embodiment of the invention, a portion of the barrier material 230 and the metal seed material 240 which is not underlying the material of the metal lines M2 or the material of the metal lines M1 may be removed. Removing these portions of the barrier material and the seed material serves to electrically isolate each of the metal lines from the other metal lines. The removal may be accomplished by an etching process. The etching process may be an anisotropic etching process. The etching process may be a wet etch or a dry etch.

Figure 11:
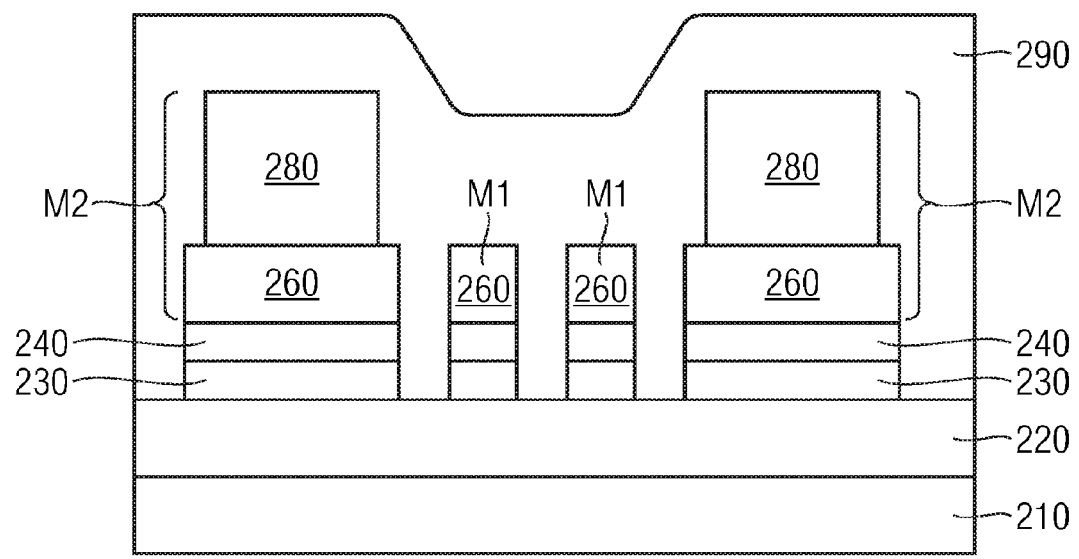

At this point in the process, there are several different ways to proceed to continue the process. Referring to FIG. 11, after the thick and thin metal lines are electrically isolated from each other, a protective passivation layer 290 is deposited over the structure of FIG. 10 to form the structure shown in FIG. 11. Generally, the passivation layer 290 may be formed of any dielectric material. In one embodiment, the passivation layer 290 may comprise an imide such as a polyimide. In other embodiments, the passivation layer 290 may comprise an oxide, a nitride or an oxynitride. The passivation layer may, for example, be formed of silicon dioxide, silicon nitride, a silicon oxynitride or combinations thereof. In one or more embodiments, the passivation layer 290 may comprise one or more materials selected from the group consisting of SiN, SiON, SiC, SiO, $SiO_2$, and combinations thereof.

Figure 12:
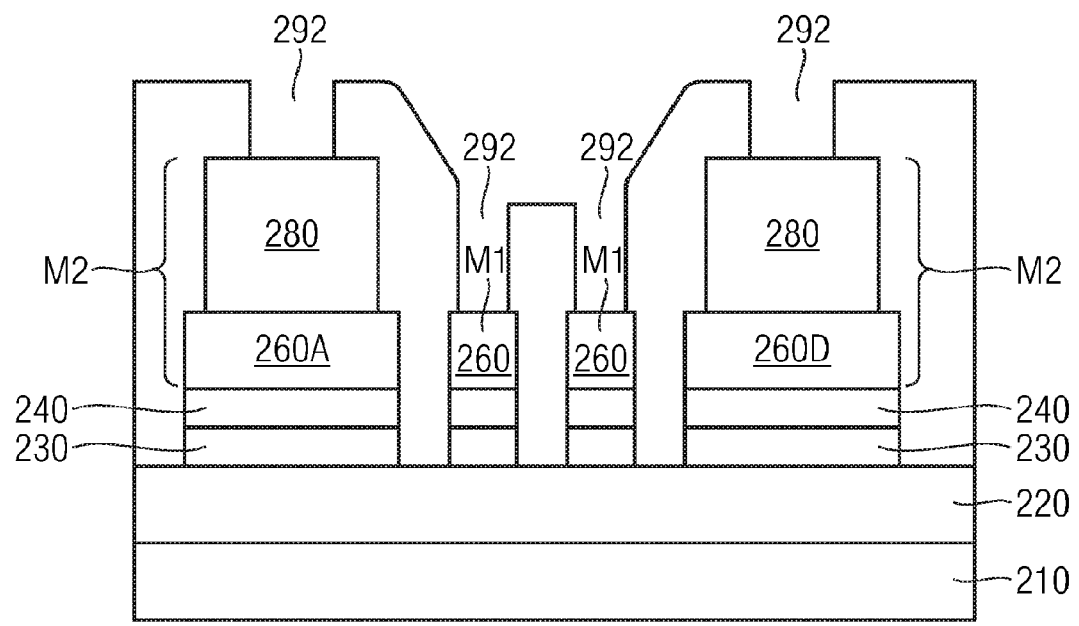
Figure 13A:
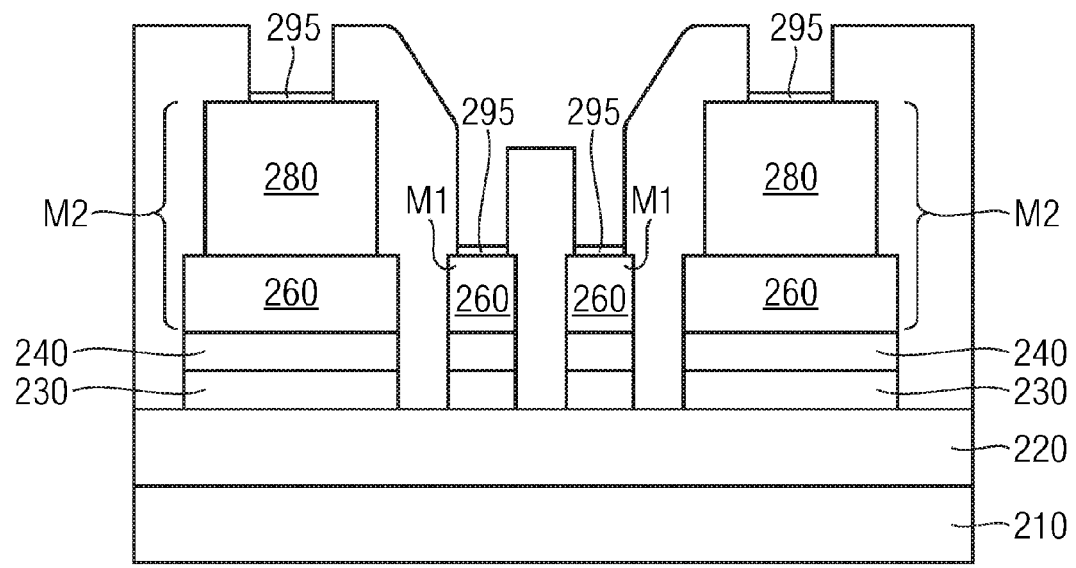

Referring to FIG. 12, after the passivation layer 290 is formed, openings 292 may be formed in the passivation layer so that the metal lines M2 as well as the metal lines M1 are exposed. Referring to FIG. 13A, a passivation material 295 may then be disposed within each of the openings and on top of the exposed metallic material of each of the metal lines. The passivation material may comprise a metallic material. The passivation material 295 may be a single layer of a metallic material. The passivation material may include two or more layers of different materials. For example, the passivation material may include two layers such as NiP/Pd (a Pd layer over a NiP layer) or NiMoP/Pd (a Pd layer over a NiMoP layer). As another example, the passivation material may include three layers such as NiP/Pd/Au (an Au layer over a Pd layer over a NiP layer) or NiMoP/Pd/Au (an Au layer over a NiMoP layer over a NiMoP layer). It is possible that more than three layers be used.

Figure 13B:
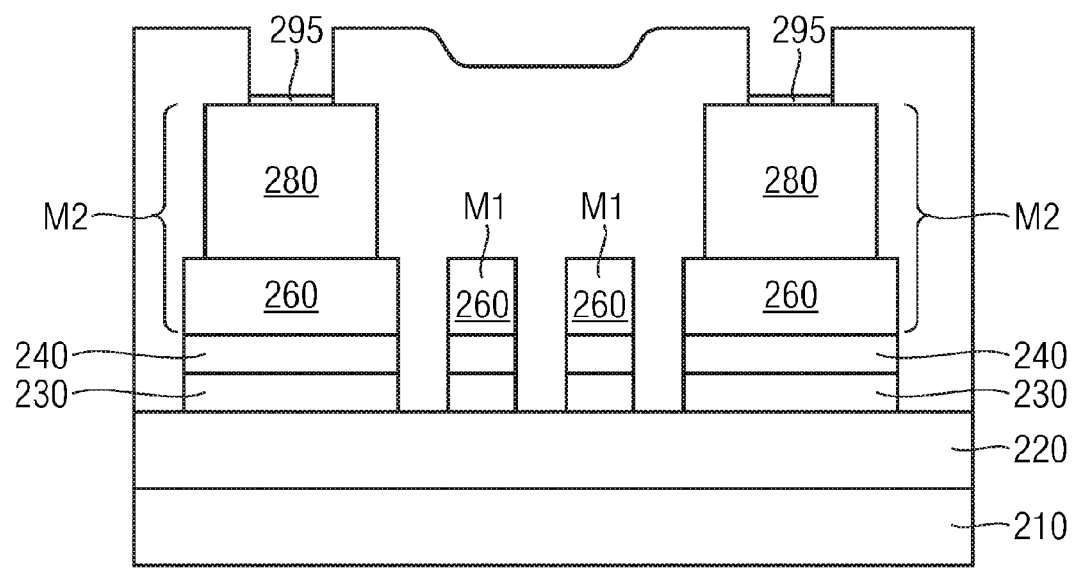
FIG. 13B provides an embodiment of a semiconductor device.
Figure 13C:
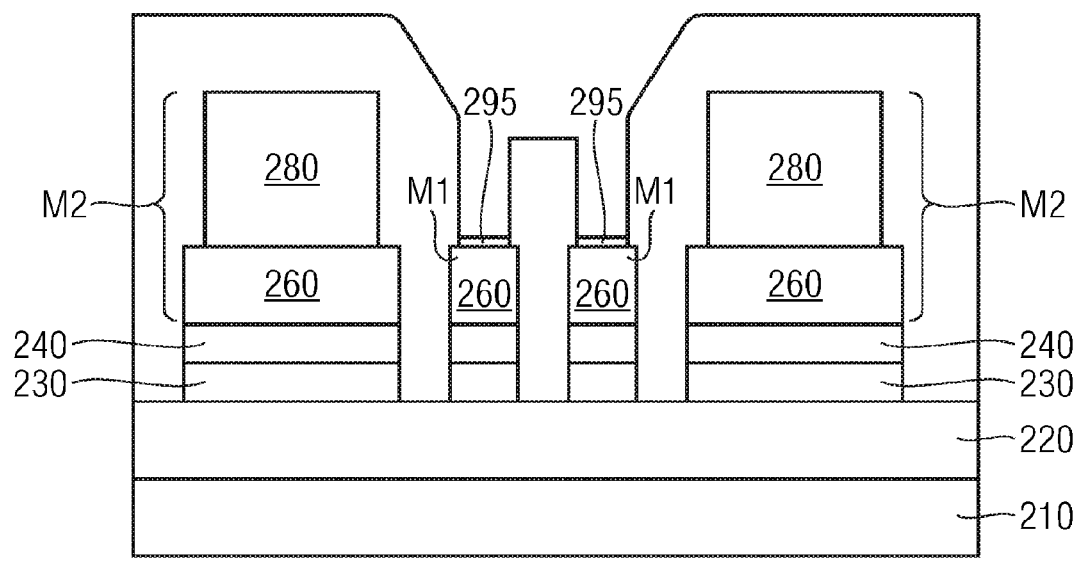
FIG. 13C provides an embodiment of a semiconductor device.

In the embodiment shown in FIG. 13A, openings are formed to expose the metal lines M2 and the metal lines M1. In one or more embodiments, openings 295 may be formed only to expose the metal lines M2 and not the metal lines M1. This is shown in FIG. 13B. Likewise, in one or more embodiments, openings 295 may be formed only to expose the metal lines M1 and not the metal lines M2. This is shown in FIG. 13C. Also, in one or more embodiments, openings may be formed to only to expose a portion of metal lines M2 and/or to only to expose a portion of the metal lines M1.

Figure 14:
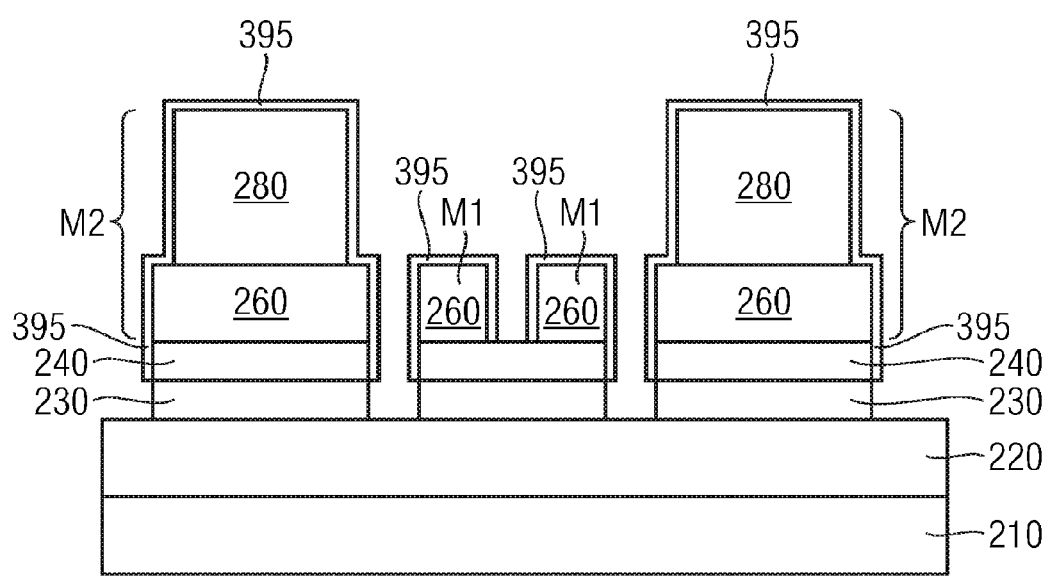
FIG. 14 provides an embodiment of a semiconductor device.

FIG. 14 shows another way of continuing the process from what is shown in FIG. 10. Referring FIG. 14, the metal lines M1, M2 may be passivated by a passivation material 395. The passivation material 395 may be substantially conformally deposited over the metal lines M1 and M2 as well as over the sidewall surfaces of the seed layer 240 and the sidewall surfaces of the barrier layer 230. The passivation material 395 may not remain on the sidewall surfaces of the barrier layer 230 so it is not shown over these surfaces in FIG. 14. In another embodiment, it is possible that the passivation layer 395 may also remain on the sidewall surfaces of the barrier layer 230.

In one or more embodiments, the passivation material 395 may comprise one or more metallic materials. The passivation material 395 may, for example, be a single layer of a metallic material or it may comprise two or more layers of different metallic materials. Examples of passivation layers include Ni, NiPd, NiP, Ni/Pd (a dual layer), NiP/Pd (a dual layer), NiP/Pd/Au (a tri-layer), NiMoP, CoW, CoWP, NiMoP/Pd, Ni, Ni/Pd. A first layer may, for example, be an NiP layer (or an NiMoP layer, or an NiMoP layer, or a CoWP layer or a CoW layer, etc). This first layer may have a thickness of at least 300 nm. In one or more embodiments, the thickness of the first layer may be between about 500 nm and about 5000 nm. A second metallic layer may be formed on top of the first metallic layer (which may, for example, be a layer of NiP). The second metallic layer may be a Pd layer. This second metallic layer may have a thickness of about 100 nm or greater. In one or more embodiments, the second metallic layer may have a thickness of about 100 nm to about 500 nm. Over the second layer, we place a third metallic layer. The third metallic layer may be a layer of silver or silver alloy. This third metallic layer may have a thickness of about 100 nm or less. In one or more embodiments, the third layer may have a thickness of about 50 nm or less. The first, second and third layers form a sandwich of materials. This sandwich may be a NiP/Pd/Au sandwich.

Referring again to FIG. 10, in another embodiment, it is possible the metal lines M1, M2 are not passivated at all.

Referring, to FIGS. 13A,B,C or to FIG. 14, it is seen that, in one or more embodiments, two electrically isolated thinner metal lines M1 and two electrically isolated thicker metal lines M2 are formed. More generally, in one or more embodiments, one or more thicker metal lines may be formed and, one or more thinner metal lines may be formed where the thicker metal lines are thicker than the thinner metal lines. In one or more embodiments, two or more of the metal lines may be spacedly disposed for each other. In one or more embodiments, two or more of the metal lines may be electrically isolated from each other. In one or more embodiments, two or more of the metal lines may be electrically coupled together.

The thicker and the thinner metal lines may all be part of the final metal layer of a semiconductor device. Hence, a final metal layer for a semiconductor device or semiconductor chip may be formed which comprises at least a first metal layer and a second metal layer formed after the first metal layer. In one or more embodiments, the first and second metal layers may form a plurality of metal lines. In one or more embodiments, the metal lines may be spacedly disposed from each other (for example, they may be physically spaced apart from each other). One or more of the metal lines may have a first thickness while one or more of the metal lines may be have a second thickness which is thicker than the first thickness.

As part of a final metal layer (also referred to as a top metal layer), in one or more embodiments, it is possible that the thin metal lines may be used for logic applications while the thick metal lines may be used for power applications. The thick and thin metal lines which are part of the final or top metal layer may be referred to as final metal lines or top metal lines. Hence, the final metal layer may include at least one thinner final metal line and at least one thicker final metal line where the thicker lines have a thickness greater than the thinner lines.

It is noted that the process described above shows the formation of a final metal layer having one or more final metal lines with a first thickness and one or more final metal lines with a second thickness greater than the first thickness. However, the process may be continued by forming (such as by a growth process or a deposition process) one or more additional metal layers (possibly, for example, by depositing additional layers of galvanic resist, patterning these layers and using an electroplating process to deposit additional metal layers). A final metal layer may be formed which comprises a plurality of final metal lines. The plurality of final metal lines may have a plurality of thicknesses. The plurality of final metal lines may be spacedly disposed from each other. At least two of the plurality of final metal lines may be electrically isolated from each other. At least two of the plurality of final metal lines may be electrically coupled to each other.

Referring again to the embodiments shown in FIG. 8, FIG. 12 or in FIGS. 13A through 13C, it is seen that in the embodiment shown, the metal lines M2 are formed so that the portion 260A of first metal layer 260 completely underlies the portion 280A of second metal layer 280. Likewise, the portion 260B of the first metal layer 260 completely underlies the portion 280B of the second metal line 280.

Figure 15A:
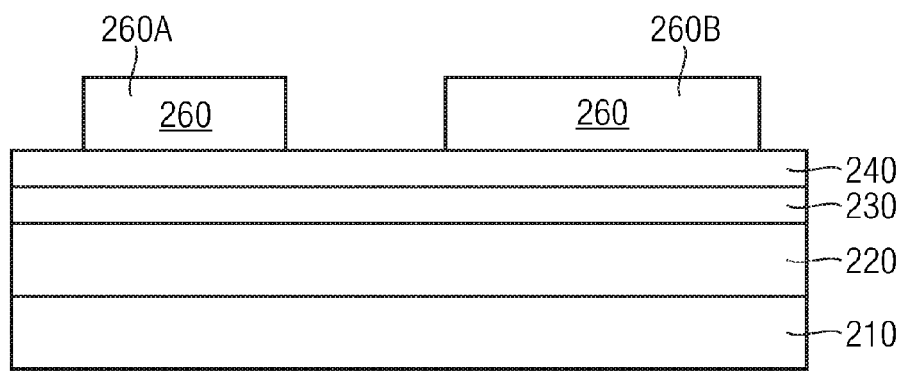
FIG. 15A through 15D shows an embodiment for making an embodiment of a semiconductor device.
Figure 15B:
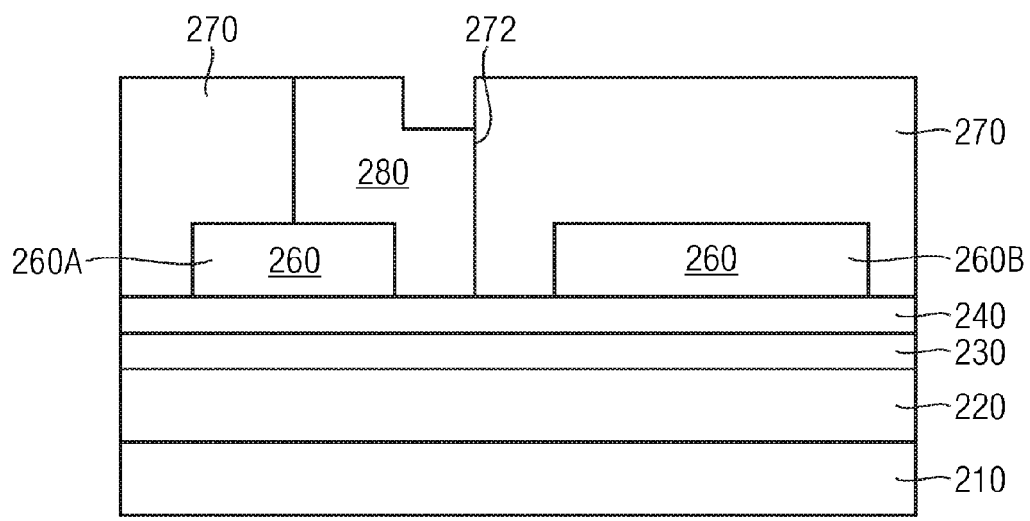
Figure 15C:
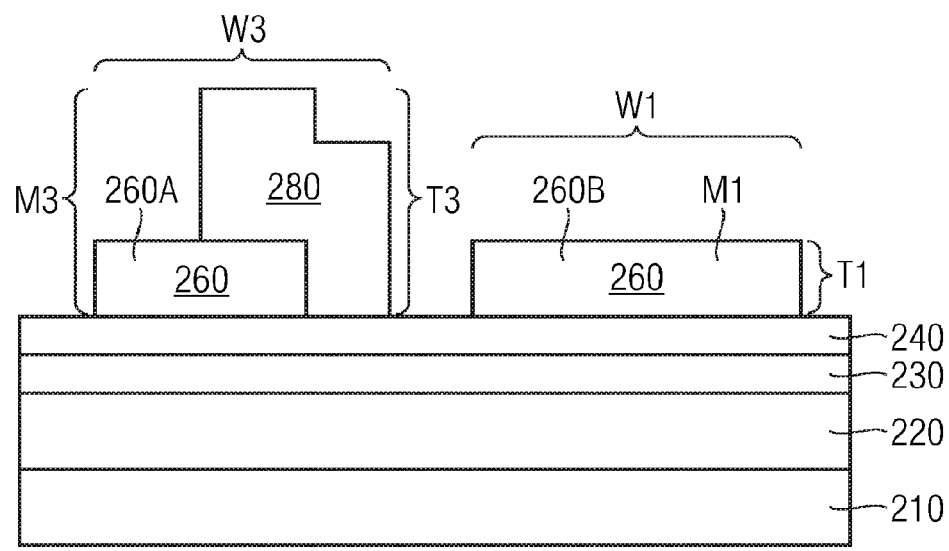
Figure 15D:
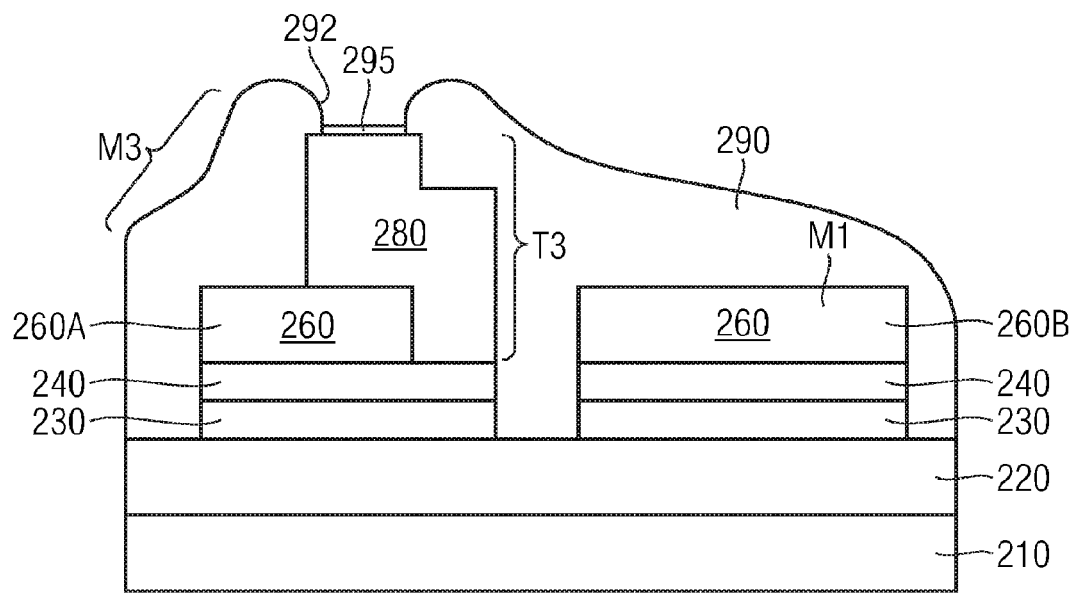

Another embodiment is shown in FIG. 15D where the second metal layer 280 only partially overlies the first metal layer portion 260A. (Of course, in yet another embodiment, the second metal layer 280 may made wider so that all of the portion 260A underlies the layer 280). In the embodiment shown in FIG. 15D, the metal line M1 includes the first metal layer portion 260B but does not include any portion of the second metal layer 280. The metal line M1 has a thickness T1. The metal line M3 includes the first metal layer portion 260A as well as the second metal layer 280. The metal line M3 has a thickness T3. The thickness T3 of metal line M3 is greater than the thickness T1 of the metal line M1. FIG. 15D shows how the metal lines M1 and M3 may be electrically isolated from each other by etching through the barrier layer 230 and seed layer 240. FIG. 15D further shows passivation layer 290 and passivation layer 295. The metal lines M1, M3 may also be passivated in a way which is similar to that shown in FIG. 14.

FIGS. 15A through 15D describes an embodiment for a method of making the embodiment shown in FIG. 15D. FIG. 15A shows that the first metal layer 260 comprises spacedly disposed first layer portions 260A and 260B. These first layer portions 260A, 260B may be formed in a manner similar to that shown in FIGS. 1 through 5. Referring to FIG. 15B, a galvanic resist 270 may be formed over the structure from FIG. 15A. An opening 272 may be formed in the resist. A second metal layer 280 may be formed within the opening. This may be done using an electroplating process. The second metal layer 280 partially overlies the portion 260A of first metal layer 260. A portion of layer 280A is also formed on the seed layer 240. As shown in FIG. 15C, the galvanic resist 272 may then be removed. Referring to FIG. 15D, the seed layer 240 and the barrier layer 230 may then be etched at certain locations so that the metal lines M1 and M3 become electrically isolated. A passivation layer 290 may then be formed over the structure, an opening 292 may be formed over the second metal layer 280 and a passivation layer 295 may be formed.

In the embodiment shown in FIG. 15C, the metal line M3 has a width W3 and a thickness T3. The metal line M1 has a width W1 and a thickness T1. In one or more embodiments, the width W3 may be greater than the width W1. In one or more embodiments, the width W3 may be less than the width W1. In one or more embodiments, the width W3 may be equal to the width W1.

Figure 16A:
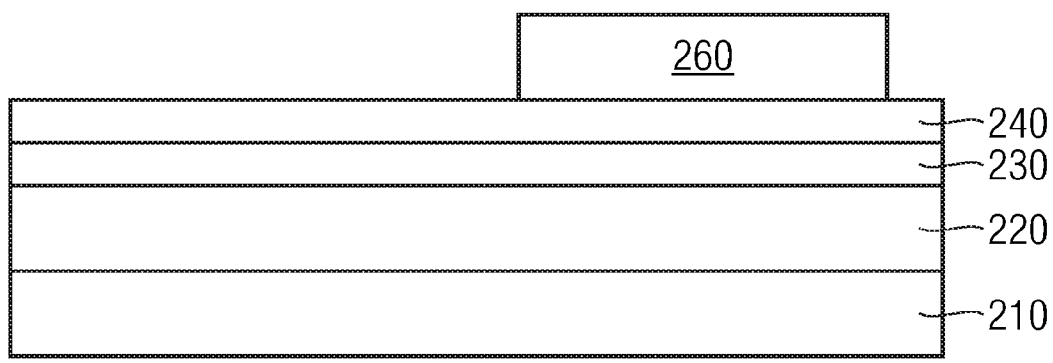
FIGS. 16A through 16D shows an embodiment for making an embodiment of a semiconductor device.
Figure 16B:
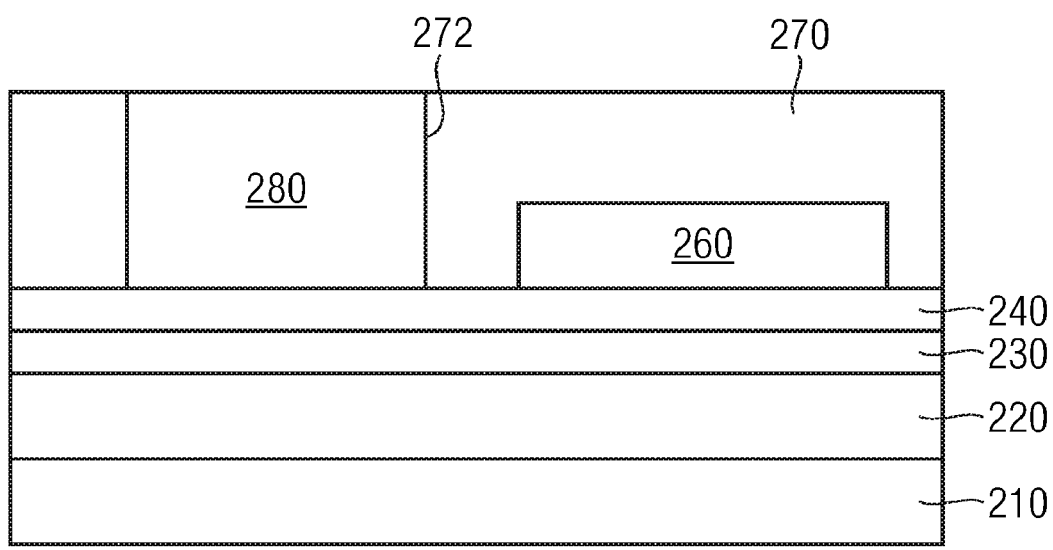
Figure 16C:
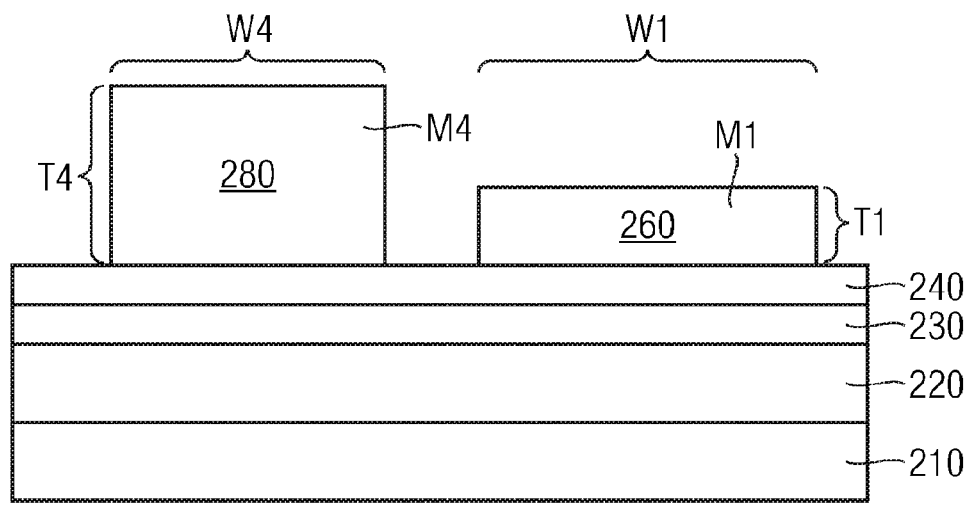
Figure 16D:
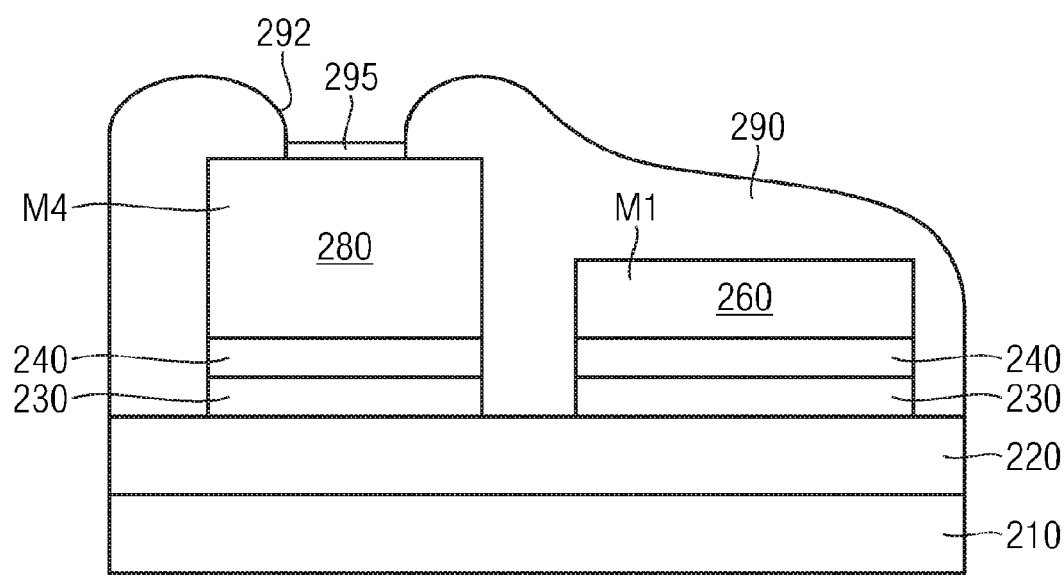

Another embodiment is shown in FIG. 16D where the second metal layer 280 is spacedly disposed from the first metal layer 260. In the embodiment shown in FIG. 16D, the metal line M1 includes the first metal layer 260 but does not include any portion of the second metal layer 280. The metal line M1 has a thickness T1. Likewise, metal line M4 includes the second metal layer 280 but does not include any portion of the second metal layer 280. The metal line M4 has a thickness T4. The thickness T4 of the metal line M4 is greater than the thickness T1 of the metal line M1. FIG. 16D shows how the metal lines M1 and M4 may be electrically isolated from each other by etching through the barrier layer 230 and seed layer 240. FIG. 16D further shows passivation layer 290 and passivation layer 295. The metal lines M1, M4 may also be passivated in a way which is similar to that shown in FIG. 14.

FIGS. 16A through 16D describes an embodiment for a method of making the embodiment shown in FIG. 16D. FIG. 16A shows a first metal layer 260. This layer may be formed by an electroplating approach similar to that shown in FIGS. 1 through 5. Referring to FIG. 16B, a galvanic resist 270 may be formed over the structure from FIG. 16A. An opening 272 may be formed in the resist. A second metal layer 280 may be formed within the opening. This may be done using an electroplating process. The second metal layer 280 is formed on the seed layer 240 but not on the first metal layer 260. As shown in FIG. 16C, the galvanic resist 270 may then be removed. Referring to FIG. 16D, the seed layer 240 and the barrier layer 230 may then be etched at certain locations so that the metal lines M1 and M4 become electrically isolated. A passivation layer 290 may then be formed over the structure, an opening 292 may be formed over the second metal layer 280 and a passivation layer 295 may be formed. In the embodiment shown in FIGS. 16A through 16D, the first layer 260 was deposited before the second layer 280. However, in another embodiment, it is possible that the layer 280 (the thicker one) is deposited before layer 260 (the thinner one).

In the embodiment shown in FIG. 16C, the metal line M4 has a width W4 and a thickness T4. The metal line M1 has a width W1 and a thickness T1. In one or more embodiments, the width W4 may be greater than the width W1. In one or more embodiments, the width W4 may be less than the width W1. In one or more embodiments, the width W4 may be equal to the width W1.

Figure 17A:
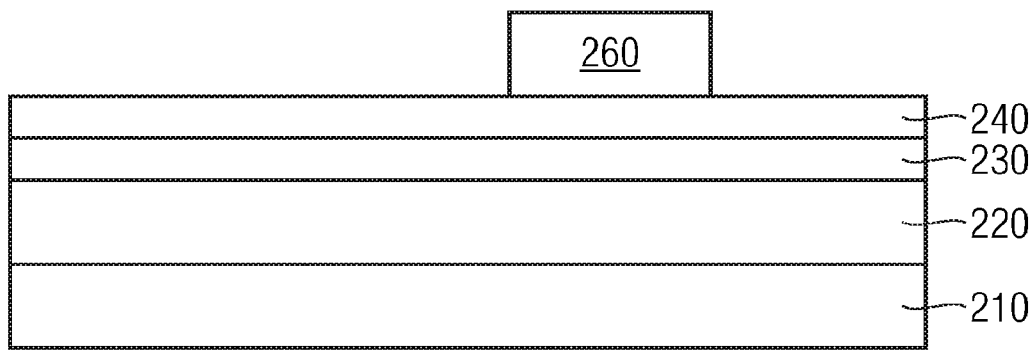
FIGS. 17A through 17D shows an embodiment for making an embodiment of a semiconductor device.
Figure 17B:
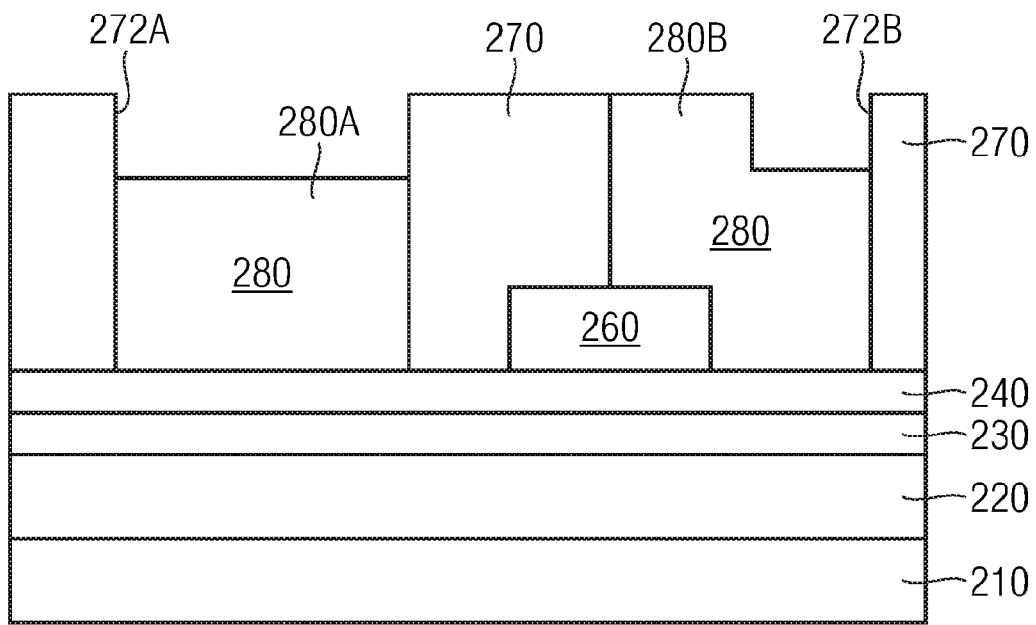
Figure 17C:
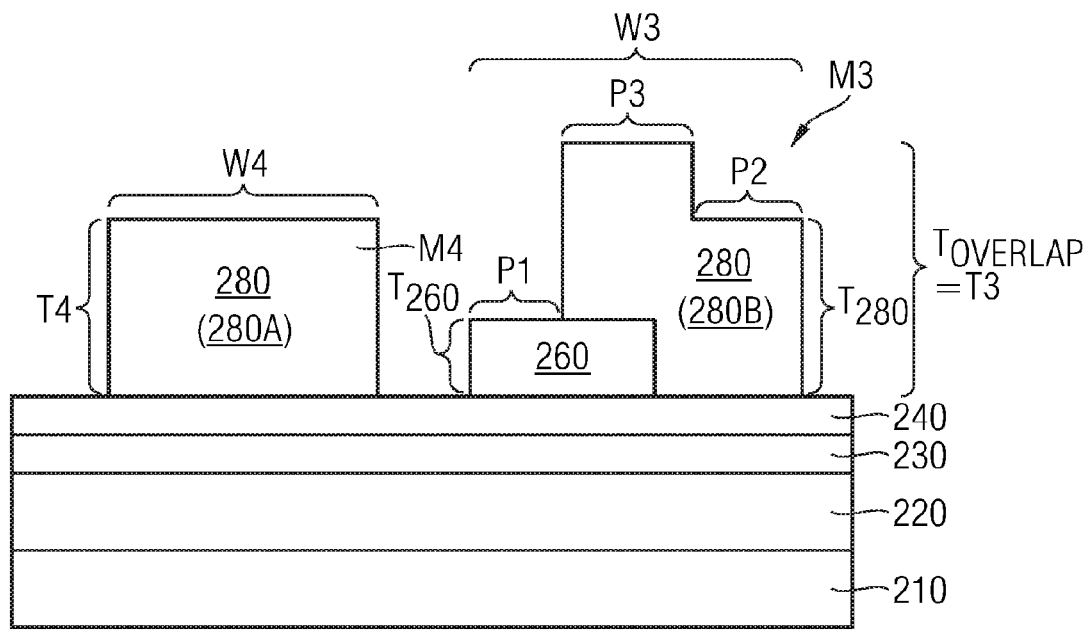
Figure 17D:
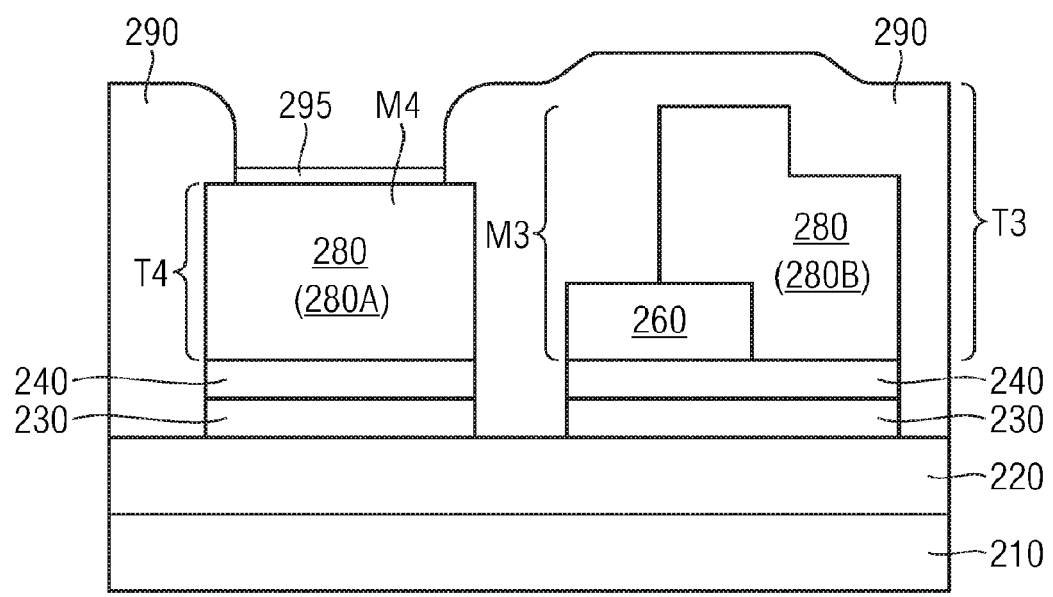

Another embodiment is shown in FIG. 17D where there are two spacedly disposed metal lines M4 and M3. In the embodiment shown in FIG. 17D, the metal line M4 comprises the second metal layer 280 but not the first metal layer 260. The metal line M4 has a thickness T4.

Referring to FIG. 17C, the second metal line M3 comprises the first metal layer 260 and the portion 280B of the second metal layer 280. Metal line M3 comprises a first portion P1 that includes the first metal layer 260 but not the second metal layer 280. This portion P1 has a thickness $T_{260}$ of the first metal layer 260. The metal line M3 comprises a second portion P2 that includes the second metal layer 280 but not the first metal layer 260. This second portion P2 has a thickness $T_{280}$ which is the thickness of the second metal layer 280. The metal line M3 has a third portion P3 which includes the first metal layer 260 and the second metal layer 280. The portion P3, shown in FIG. 17C, is that portion of metal line M3 where the second metal layer 280 overlies the first metal layer 260. The thickness of the portion P3 is the sum of the thickness $T_{260}$ of first metal layer 260 and the thickness $T_{280}$ of second metal layer 280. This is shown as thickness $T_{OVERLAP}$. The thickness T3 of the metal line M3 is the maximum of the thicknesses of each of the portions P1, P2 and P3. Hence, the metal line M3 has a thickness T3 which is equal to the thickness $T_{OVERLAP}$.

In the embodiment shown in FIG. 17C, the metal line M3 has three portions where each portion has a different thickness. In the embodiment shown in FIG. 17C, the thickness of metal line M3 changes in the direction along the width of the metal line.

It is noted that this discuss of metal line M3 as shown in FIGS. 17C and 17D is also true for the metal line M3 shown in FIGS. 15C and 15D.

FIGS. 17A through 17D describes an embodiment for a method of making the embodiment shown in FIG. 17D. FIG. 17A shows a first metal layer 260. This layer may be formed by an electroplating approach similar to that shown in FIGS. 1 through 5. Referring to FIG. 17B, a galvanic resist 270 may be formed over the structure from FIG. 17A. Openings 272A and 272B may be formed in the resist. A second metal layer 280 may be formed within each of the openings. Portion 280A is formed in opening 272A. Portion 280B is formed in opening 272B. This may be done using an electroplating process. As shown in FIG. 17C, the galvanic resist 270 may then be removed. Referring to FIG. 17D, the seed layer 240 and the barrier layer 230 may then be etched at certain locations so that the metal lines M3 and M4 become electrically isolated from each other. A passivation layer 290 may then be formed over the structure, an opening 292 may be formed over the second metal layer 280 and a passivation layer 295 may be formed.

In the embodiment shown in FIG. 17C, the metal line M3 has a width W3 and a thickness T3. The metal line M4 has a width W4 and a thickness T4. In one or more embodiments, the width W4 may be greater than the width W3. In one or more embodiments, the width W4 may be less than the width W3. In one or more embodiments, the width W4 may be equal to the width W3.

Figure 18A:
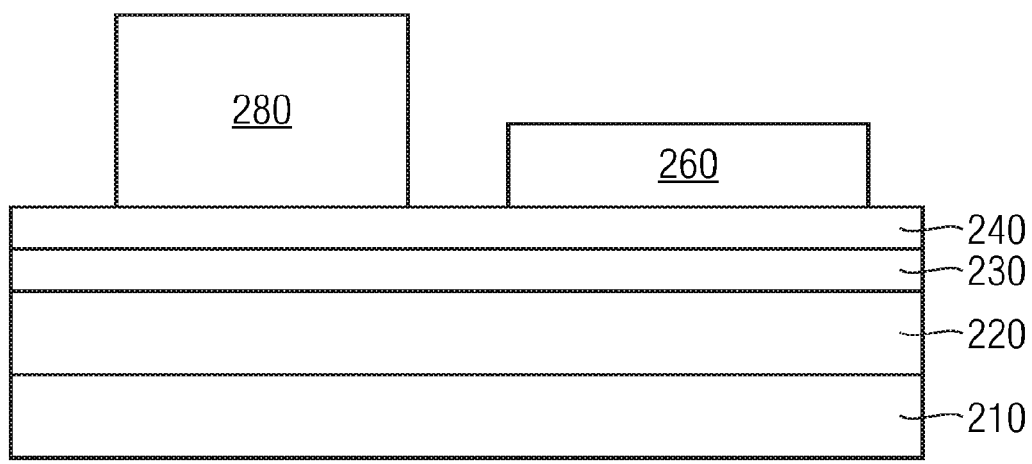
FIGS. 18A through 18D show an embodiment of a method of making an embodiment of a semiconductor device.
Figure 18B:
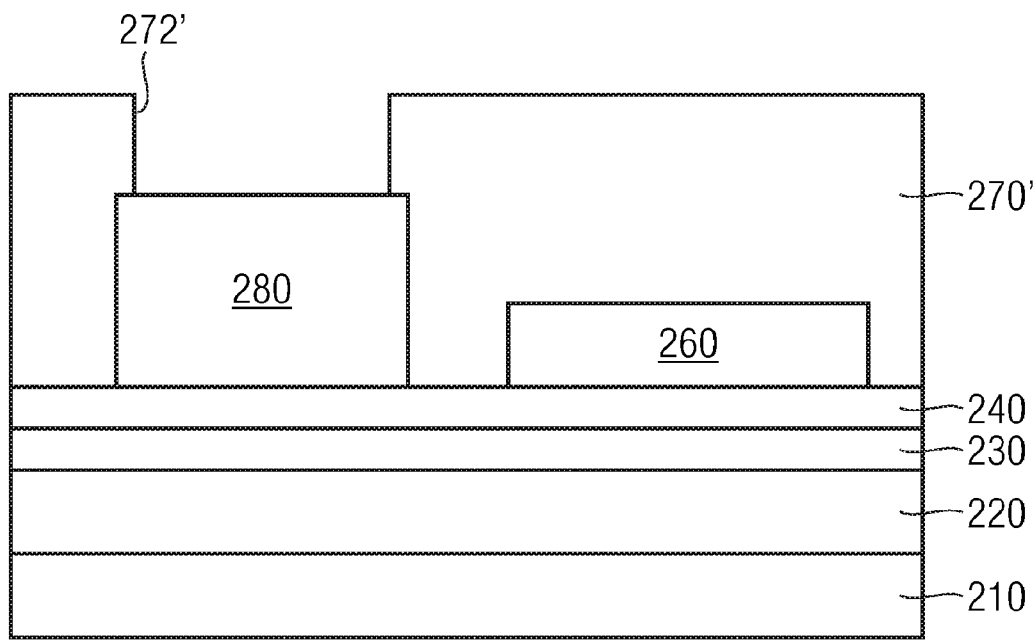
Figure 18C:
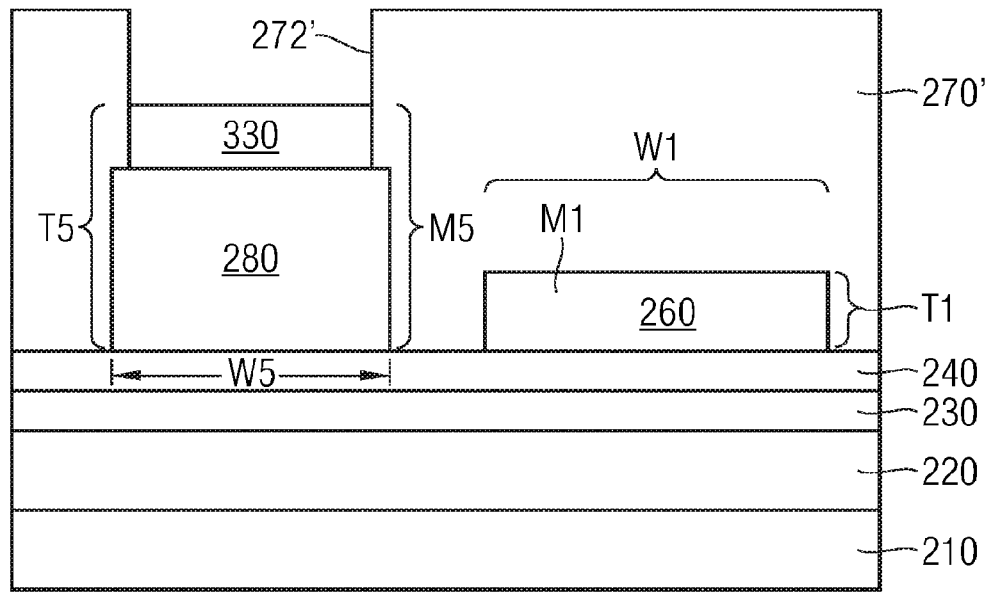
Figure 18D:
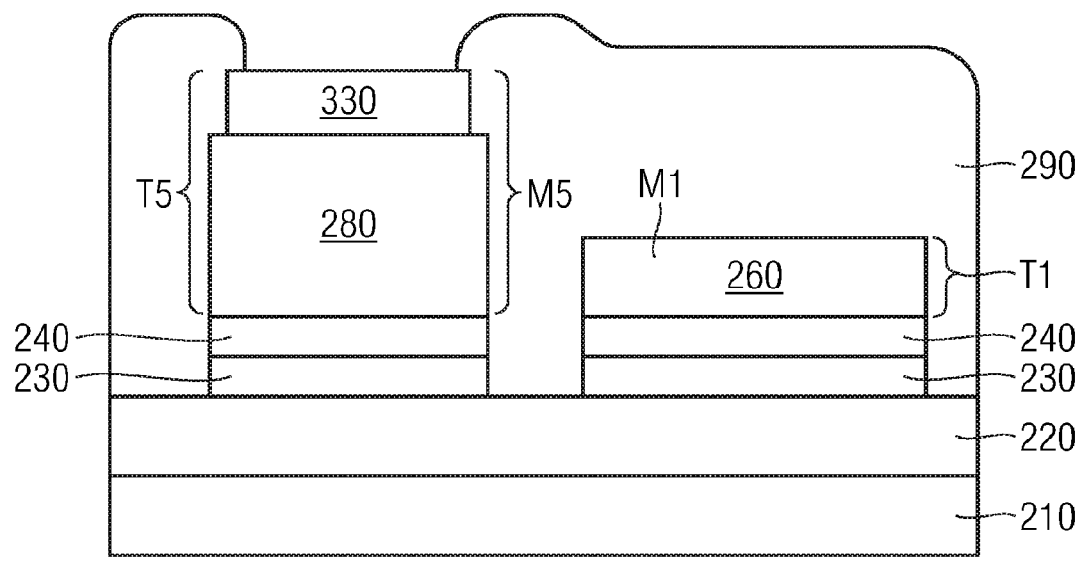

Another embodiment is shown in FIG. 18D where there are two spacedly disposed metal lines M1 and M5. In the embodiment shown in FIG. 18D, the metal line M5 comprises the second metal layer 280 as well as a third metal layer. The metal line M1 comprises the first metal layer 260 but not the second metal layer 280 and not the third metal layer 330. In the embodiment shown, the metal line M5 has a thickness T5 that is larger than the thickness T1 of the metal line M1.

FIGS. 18A through 18D describes an embodiment for a method of making the embodiment shown in FIG. 18D. FIG. 18A shows a first metal layer 260 and a second layer 280. These layers may be formed by two electroplating steps: one for layer 260 and one for layer 280. This may be done using processing steps similar to those described for FIGS. 1 through 8. Referring to FIG. 18B, a galvanic resist 270' may be formed over the structure from FIG. 18A. Opening 272' may be formed in the resist 270' over the metal layer 280.

Referring to FIG. 18C, an electroplating process may then be used to form a third metal layer 330 over a top surface of the second metal layer 280. Referring to FIG. 18D, the barrier layer 230 and seed layer 240 may be etch through and the galavanic resist 270' may be removed. A passivation layer 290 may be applied.

Hence, referring to FIGS. 18C and 18D, it is seen that two metal lines are formed by the process. These are metal line M1 and metal line M5. The metal line M1 includes the first metal layer 260 but not the second metal layer 280 or the third metal layer 330. A metal line M5 is formed that include a second metal layer 280 and a third metal layer 330.

In the embodiment shown in FIG. 18C, the metal line M5 has a width W5 and a thickness T5. The metal line M1 has a width W1 and a thickness T1. In one or more embodiments, the width W5 may be greater than the width W1. In one or more embodiments, the width W5 may be less than the width W1. In one or more embodiments, the width W5 may be equal to the width W1.

The third metal layer 330 shown in FIGS. 18C and 18D may comprise any metallic material. The metallic material may comprise a pure metal or a metal alloy. The metallic material may, for example, comprise Pd/Ni, Co, CoW, CoWP, NiB, Ni, NiP, Sn, Ag, Au, Pd, Cu or a combination or sandwich of two or more of these materials (for example, PdNi, Ni/Pd, NiPd/Pd/Au, NiP/Ni/Pd/Au, etc). Generally, the third metal layer may have any thickness. In one or more embodiments, the thickness of the third metal layer 330 may be about 500 nm or greater. The thickness of the third metal layer may even reach about 5000 nm In the embodiment shown, the third metal layer 330 is thinner than the second metal layer 280. Hence, the embodiment shows how a thinner metal layer may be formed over a thicker metal layer. However, in another embodiment, it is possible that the third metal layer is thicker than the second metal layer. Likewise, in another embodiment, it is possible that the third metal layer 330 has about the same thickness as the second metal layer 280. In another embodiment, it is also possible that the third metal layer 330 be formed over the first metal layer 260.

In the embodiments shown in FIGS. 9, 16A, 17A, and 18A the first metal layer 260 may be formed before the second metal layer 280. In the embodiment shown, the first metal layer 260 is thinner than the second metal layer 280. However, in one or more embodiments, it is also possible that the first metal layer be thicker than the second metal layer so that the thicker layer is formed before the thinner layer. Hence, in one or more embodiments of the invention the metal lines having different thickness may be formed by first depositing a thick metal layer and then depositing a thin metal layer in a downstream processing step.

Generally, two or more metal layers (such as first metal layer 260, second metal layer 280 and third metal layer 330 as shown in FIG. 18D) to form a final metal layer having a plurality of final metal lines with a plurality of thicknesses. Each of the final metal lines may be spacedly disposed from the other final metal lines. Each of the final metal lines may be electrically isolated from the other metal lines. Two or more of the final metal lines may be electrically coupled together. Two or more may be coupled to the same ground or to the same potential). The final metal layer may have final metal lines with two, three, four, five or more thicknesses.

Figure 19:
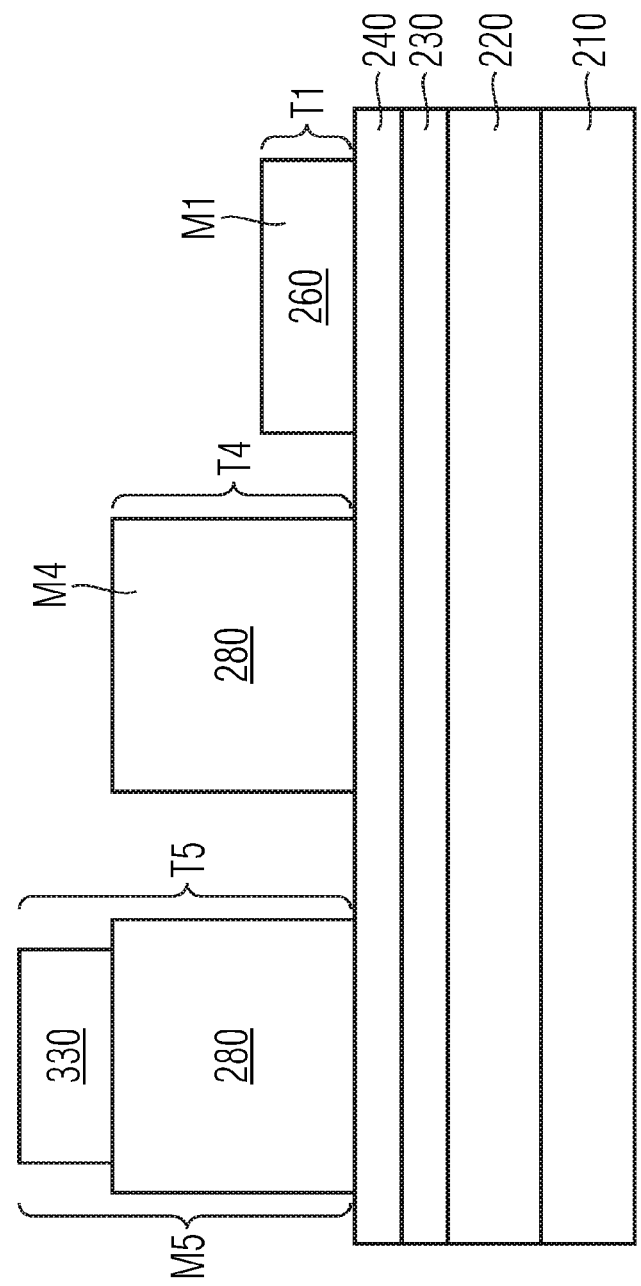
FIG. 19 shows an embodiment of a semiconductor device.

FIG. 19 shows an embodiment of a structure of the present invention wherein a metallization layer includes a metal line M1 having a thickness T1, a metal line M4 with a thickness T4 and a metal line T5 with a thickness T5. In the embodiment shown, the thickness T5 is greater than the thickness T4 which is greater than the thickness T1. The metal line M1 is formed from first metal layer 260. The metal line M4 is formed from the second metal layer 280. The final metal line M5 is formed from both the second metal layer 280 and the third metal layer 330. Hence, this is an example of a metallization layer having metal lines with three different thicknesses. In one or more embodiments, the metallization layer may be a final metal layer. Likewise, the metal lines M1, M4 and M5 may be final metal lines.

Figure 20A:
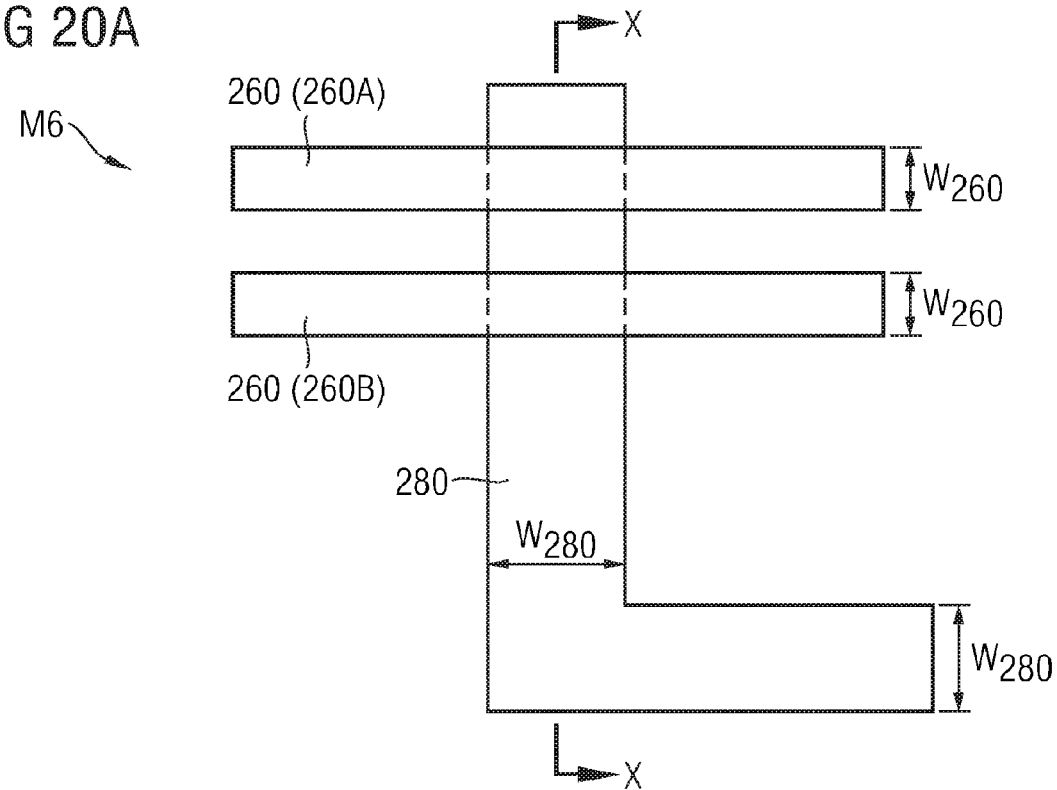
FIG. 20A shows an embodiment of a final metal layer.
Figure 20B:
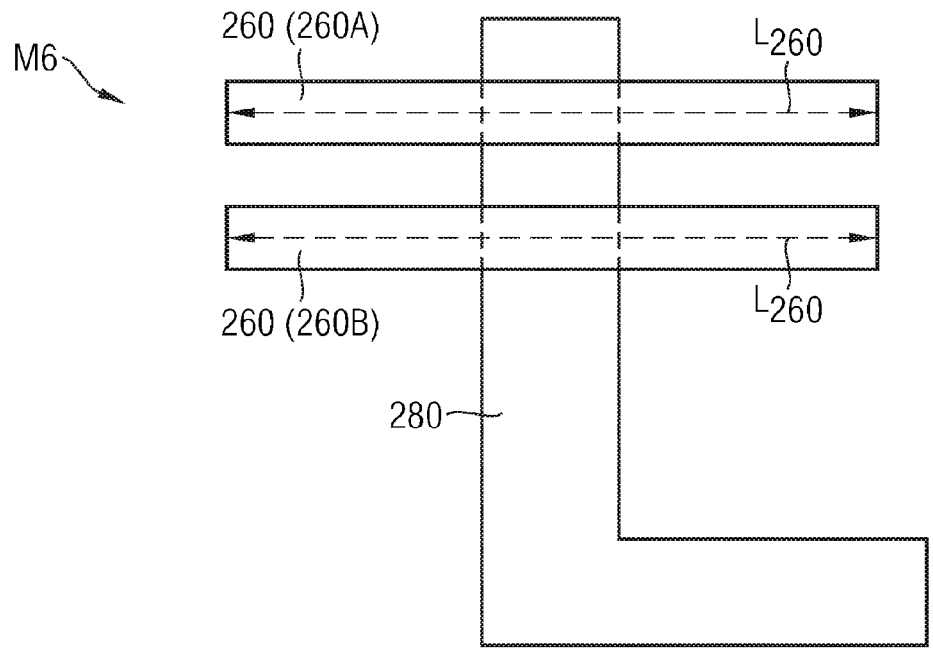
FIG. 20B shows an embodiment of a final metal layer.
Figure 20C:
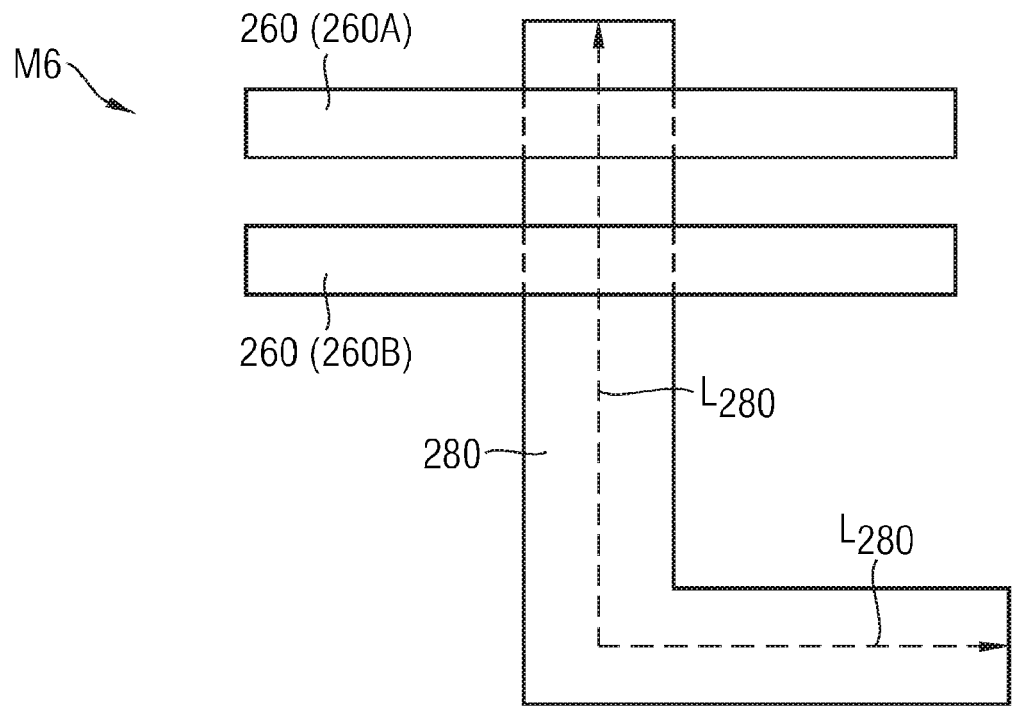
FIG. 20C shows an embodiment of a final metal layer.
Figure 20D:
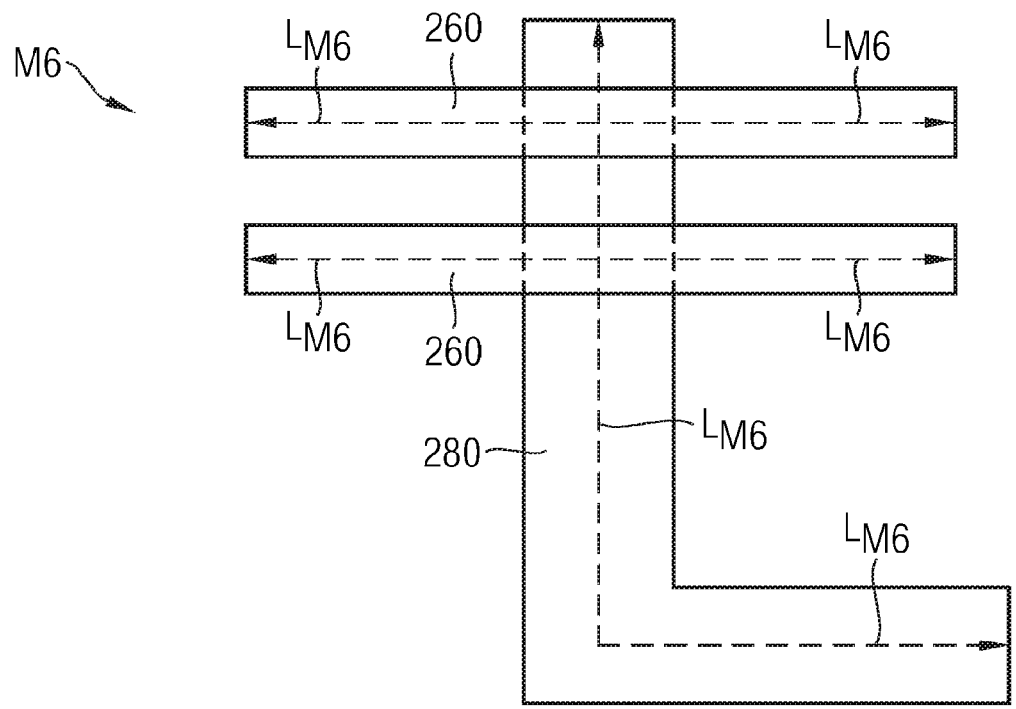
FIG. 20D shows an embodiment of a final metal layer.
Figure 20E:
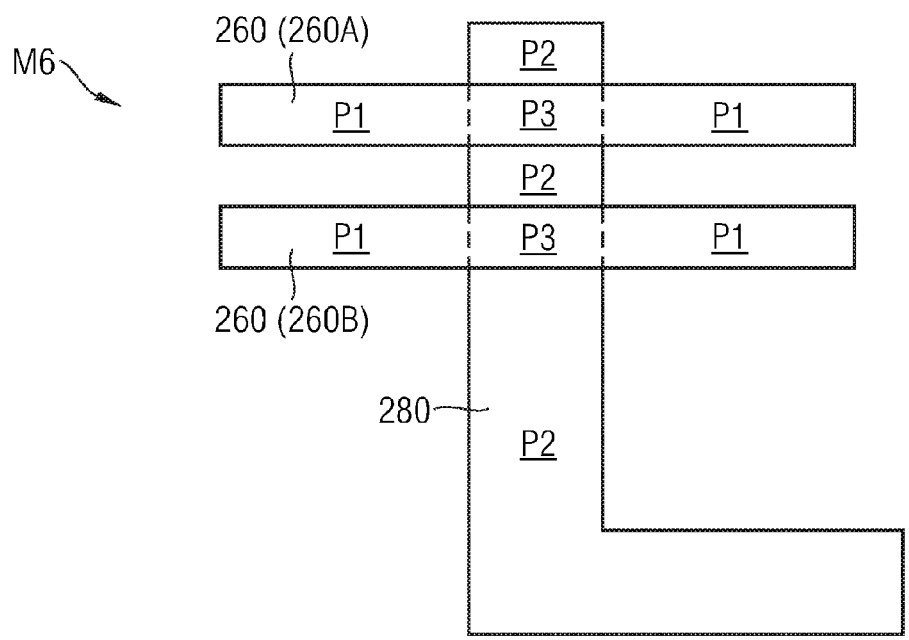
FIG. 20E shows an embodiment of a final metal layer.
Figure 20F:
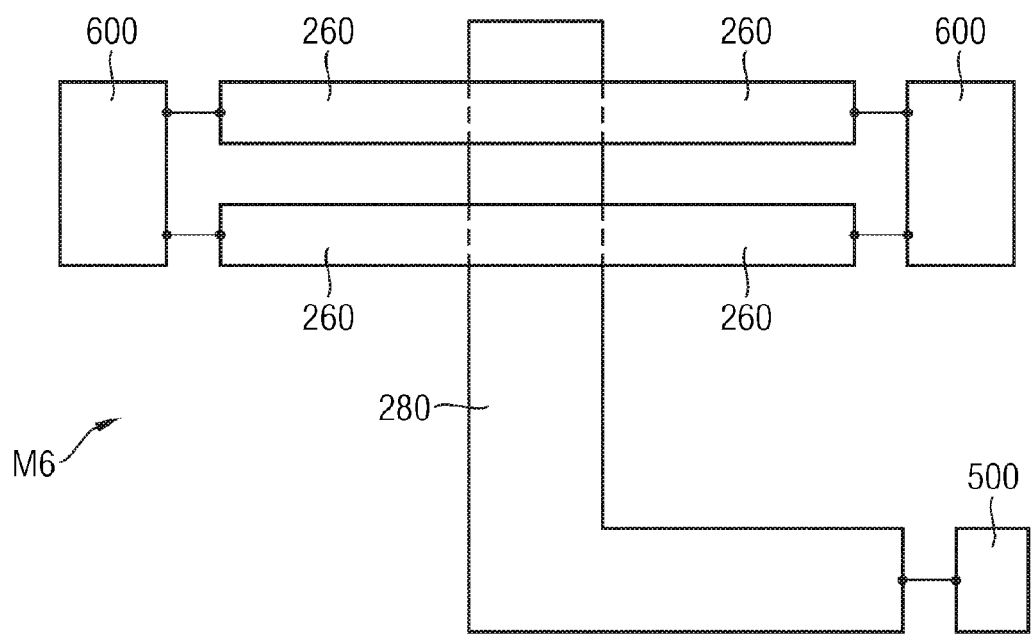
FIG. 20F shows an embodiment of a final metal layer.
Figure 20G:
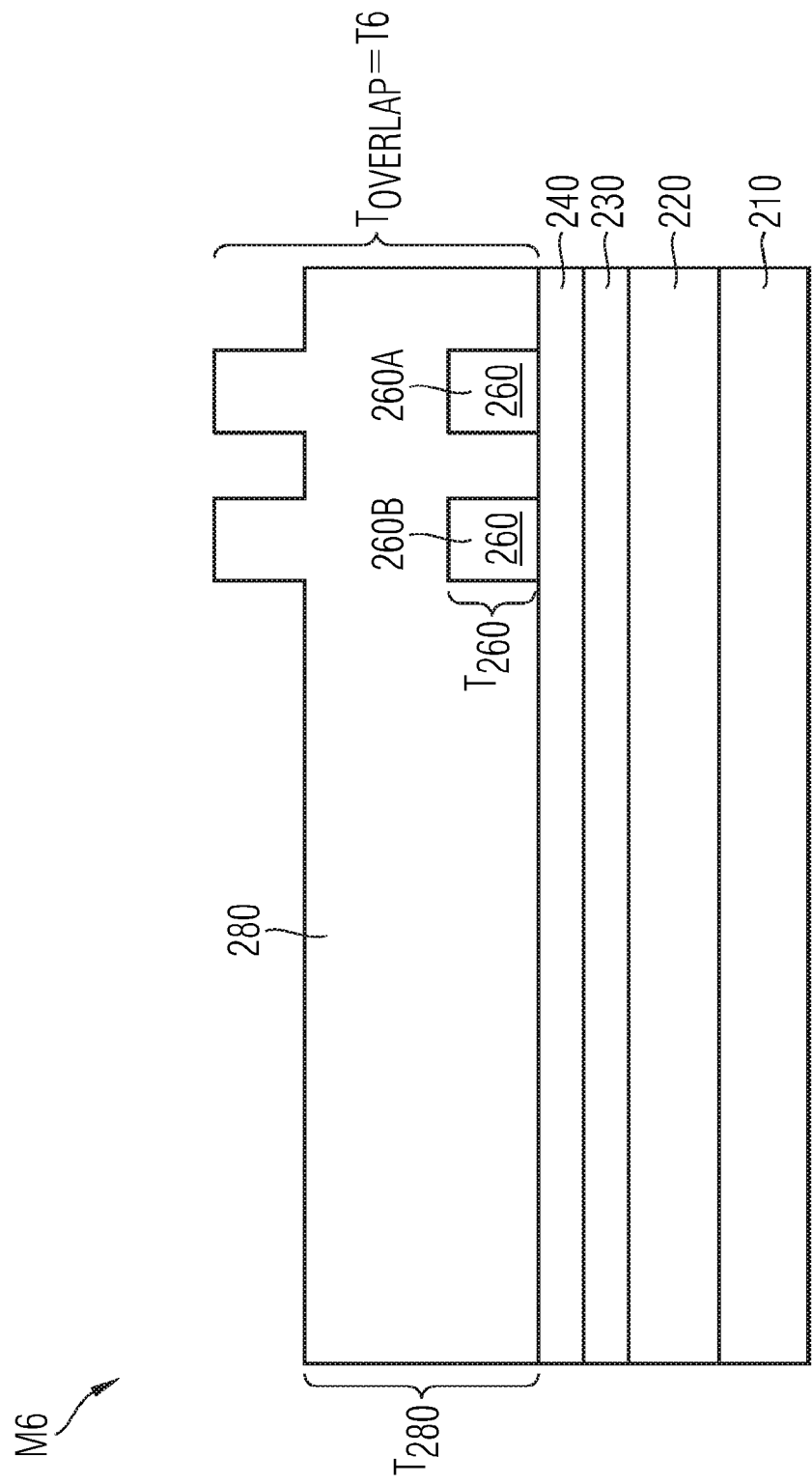
FIG. 20G shows a cross sectional view of an embodiment of a semiconductor device.

Another embodiment of is shown in FIGS. 20A through 20G. The embodiment shows an example of a final metal layer comprising a metal line M6 that has a plurality of portions having different thicknesses. The metal line M6 is formed from a first metal layer 260 (that includes a first portion 260A and a second portion 260B) and a second metal layer 280. FIG. 20A shows a top view of the metal line M6. FIG. 20G shows a cross sectional view of metal line M6 through X-X that shows the substrate 210, the layer 220, the barrier layer 230 and the seed layer 240 (e.g. metallic seed layer).

The metal line M6 may be formed in different ways. In one or more embodiment, the metal line M6 may be formed by depositing a first galvanic resist over the seed layer 240, patterning the first galvanic resist to form openings in the first resist, depositing the first metal layer 260 by an electroplating process to form portions 260A and 260B, removing the first galvanic resist, depositing a second galvanic resist, patterning the second galvanic resist to form an opening in the second galvanic resist, depositing the second metal layer 280, and removing the second galvanic resist. Referring to FIGS. 20A and 20F, it is seen that a portion of layer 280 overlies a portion of layer 260.

Referring to FIG. 20A, it is seen that the portions 260A and 260B of the first metal layer 260 each has a width $W_{260}$. The metal layer 280 has a width $W_{280}$. In the embodiment shown, the width $W_{280}$ of the second metal layer 280 is larger than the then width $W_{260}$ of the first metal layer 260. However, in other embodiments, the width of first metal layer 260 may be greater than the width of second metal layer 280. Likewise, in other embodiments, the width of first metal layer 260 may the same as the width of second metal layer 280.

Referring to FIG. 20B, the portions 260A and 260B of the first metal layer 260 each has a length $L_{260}$. Referring to FIG. 20C, the second metal layer 280 has a length $L_{280}$. In the embodiment shown, it is seen that the length $L_{280}$ of metal layer 280 has a bend. In the embodiment shown, the length of the metal layer 280 is greater than the length of each of the portions 260A and 260B of the metal layer 260. But, in other embodiments, the length of the metal layer 280 may be less than the length of one or both of the portions 260A, 260B of the metal layer 260.

The total lengthwise direction of the metal line M6 may be viewed as the combination of the length $L_{260}$ of metal layer 260 and length $L_{280}$ of metal layer 280. This is shown as length $L_{M6}$ that is shown in FIG. 20D.

Referring to FIG. 20G it is seen that the metal layer 280 has a thickness $T_{280}$. In addition, the portions 260A and 260B of metal layer 260 each have a thickness $T_{260}$. Referring to FIGS. 20E and 20G, it is seen that the metal line M6 comprises a first portion P1 that includes only the first metal layer 260 having a first thickness $T_{260}$. The metal line M6 comprises a second portion P2 that includes only the second metal layer 280 having a second thickness $T_{280}$. The metal line M6 also includes a third portion P3 where the second metal layer 280 overlaps the first metal layer 260. This portion P3 includes both the first metal layer 260 and the second metal layer 280. This portion P3 has a thickness $T_{OVERLAP}$ which may be essentially equal to the combined thickness of the first metal layer 260 and the second metal layer 280. The thickness of the entire line M6 is considered to be the maximum of the thicknesses of the portions P1, P2 and P3. Hence, the thickness of the entire line M6 has a thickness T6 which is equal to the thickness $T_{OVERLAP}$.

Hence, the metal line M6 comprises three portions with three different thicknesses. More generally, in one or more embodiments, a metal line may have a plurality of portions where each portion has a different thickness. In one or more embodiments, the thickness may change along the width of the metal line. An example of this embodiment is shown as metal line M3 shown in FIG. 17C. In one or more embodiments, the thickness may change along the length of the metal line. An example of this embodiment is shown as metal line M6 in FIG. 20A. In one or more embodiments, it is also possible that the thickness changes in the direction along the width of the metal line and in the direction along the length of the metal line.

A metal line such as the metal line M6 shown in FIG. 20A may be useful. For example, referring to FIG. 20F, it is seen that one end of the thicker portion 280 may be electrically coupled to a power supply 500. The power from the power supply 500 may be distributed from the thicker portion 280 to the thinner portions 260. The thinner portions may be used to distribution the power to logic or analog circuits 600.

In one or more embodiments, it is possible to form a single metal line that comprises a plurality of portions. Each of the portions may have different thickness. Generally, metal lines may be formed that have any shape. As one example, they may be straight. As another example, they may be bent.

All of the concepts described above may be useful for the formation of a final or top metal layer and for the formation of final or top metal lines of a semiconductor chip or device. However, it is understood that the discussion is applicable to the metallization layer of any metallization level of a semiconductor chip, a semiconductor device and/or a semiconductor structure. In one or more embodiments, metallization layers may, for example, be referred to as Metal-1, Metal-2, and so on.

It is noted that all of the metal layers described herein may comprise any metallic material. All of the metal layers described herein such as, without limitation, the metal seed layer (such as metal seed layer 240 shown in FIG. 7), the first metal layer (such as first metal layer 260 shown in FIG. 7), the second metal layer (such as second metal layer 280 shown in FIG. 8) as well as the third metal layer (such as third metal layer 330 shown in FIG. 18C) may comprise any metallic material. The metallic material may be a pure metal or an alloy. In one or more embodiments, it is possible that a pure metal may include trace amounts of impurities.

The metallic material may be an alloy. The alloy may comprise two or more metallic elements. The alloy may consist essentially of two or more metallic elements. The alloy may comprise a metallic element and a non-metallic element. In one or more embodiments, the alloy may, for example, be steel. The alloy may comprise the element carbon. Examples of pure metals include, but are not limited to, pure copper, pure gold, pure silver, pure aluminum and pure tungsten. Examples of metals include metallic copper, metallic gold, metallic silver, metallic aluminum and metallic tungsten. Examples of alloys include, but are not limited to, copper alloys, gold alloys, silver alloys, aluminum alloys and tungsten alloys. An example of an alloy is a copper aluminum alloy. The metallic material may comprise pure copper or a copper alloy. The metallic material may comprise the element copper (the element Cu). The metal seed layer, the first metal layer, the second metal layer and the third metal layer may all be formed of the same material or they (e.g. two or more of the layers) may be formed of different materials. One or more of the layers may be formed as a heterogeneous mixture of two or more materials. One or more of the layer may be a composite material. One or more of the layers may be formed as two or more sub-layers.

Hence, one or more embodiments may be a semiconductor chip and/or semiconductor device and/or semiconductor structure having a metallization layer comprising a plurality of metal lines having a plurality of thicknesses. The metal lines may all be spacedly disposed from each other. The metal lines may all be electrically isolated from each other. In one or more embodiments, the final metal layer may include a plurality of metal lines having the same thickness. The metallization layer may be a final or top metal layer. The metal lines may be final or top metal lines.

It is noted that the metal lines (such as final metal lines) as described herein may have any widths. In one or more embodiments, the thicker metal lines may have a wider width than a thinner line. However, this does not have to be the case. It may also be possible that a thicker line be narrower than a thinner line.

As an example, the metallization layer (such as final or top metal layer) may have at least one thicker metal line and at least one thinner metal line. In one or more embodiments, there may be at least two thicker metal lines. In one or more embodiments, there may be at least one thin metal line. The thicker and thinner metals may all be spacedly disposed from each other. The thicker and thinner metal lines may all be electrically isolated from each other.

A semiconductor device and/or a semiconductor chip and/or a semiconductor structure having a metallization layer (such as a final or top metal layer) with a plurality of metal lines (such as final or top metal lines) with a plurality of thicknesses (for example, with both thicker and thinner metal lines) may have many applications. For example, semiconductor devices and chips in Smart Power technologies may include DMOS transistors which require relatively thick metal lines (such as final metal lines). Such lines may require a relatively wide pitch (distance between lines). On the other hand, the same semiconductor devices and chips may include logic applications which require a metallization system with a relatively fine or narrow pitch. For the logic applications, thinner metal lines (such as thinner final metal lines) may be better suited so as to accommodate a finer pitch.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

What is claimed is:

1. A method for forming a first metal line and a second metal line of a semiconductor device, comprising:
   providing a surface, wherein the surface is planar;
   forming a first metal layer over a portion of said surface; and
   forming a second metal layer comprising forming a first portion of the second metal layer over at least one portion of said first metal layer and forming a second portion of the second metal layer in direct contact with a portion of said surface that is not occupied by said first metal layer, the second portion of the second metal layer being spaced apart from the first portion of the second metal layer, wherein a gap through the second metal layer separates the first portion of the second metal layer from the second portion of the second metal layer so that the first and second portions of the second metal layer are discrete;
   wherein the first portion of the second metal layer is further formed directly on a portion of the surface,
   wherein the second portion of the second metal layer has a uniform thickness that is greater than a thickness of the first metal layer, the thicknesses of the first and second metal layers being measured in a direction perpendicular to the provided surface,
   wherein the first metal line is formed by the first metal layer and the first portion of the second metal layer, and
   wherein the second metal line is formed by the second portion of the second metal layer.

2. The method of claim 1, wherein said surface is the surface of a metal seed layer.

3. The method of claim 1, wherein said first metal layer is formed by an electroplating process.

4. The method of claim 1, wherein said second metal layer is formed by an electroplating process.

5. The method of claim 1, wherein said first metal layer comprises the element copper and said second metal layer comprises the element copper.

6. The method of claim 1, wherein the first portion of the second metal layer is formed directly on the at least one portion of the first metal layer.

7. The method of claim 1, wherein the second portion of the second metal layer does not physically contact the first metal layer.

8. The method of claim 1, further comprising covering a plurality of sidewalls of the second portion of the second metal layer with a passivation layer.

9. The method of claim 1, further comprising depositing a passivation layer at least partially in the gap through the second metal layer between the first portion and the second portion of the second metal layer.

10. A method for forming a first metal line and a second metal line of a semiconductor device, comprising:
    providing a surface;
    forming a first metal layer over a first portion of said surface; and
    forming a second metal layer comprising forming a first portion of the second metal layer over at least one portion of said first metal layer and forming a second portion of the second metal layer in direct contact with a second portion of said surface that is not occupied by said first metal layer, the second portion of the second metal layer being spaced apart from the first portion of the second metal layer, wherein the first portion and the second portion of said surface are at a same height level, and wherein a gap through the second metal layer separates the first portion of the second metal layer from the second portion of the second metal layer so that the first and second portions of the second metal layer are discrete;
    wherein the first portion of the second metal layer is further formed directly on a portion of the surface,
    wherein the second portion of the second metal layer has a uniform thickness that is greater than a thickness of the first metal layer, the thicknesses of the first and second metal layers being measured in a direction perpendicular to the provided surface, and
    wherein the first metal line is formed by the first metal layer and the first portion of the second metal layer, and
    wherein the second metal line is formed by the second portion of the second metal layer.

11. The method of claim 10, wherein said surface is the surface of a metal seed layer.

12. The method of claim 10, wherein said first metal layer is formed by an electroplating process.

13. The method of claim 10, wherein said second metal layer is formed by an electroplating process.

14. The method of claim 10, wherein said first metal layer comprises the element copper and said second metal layer comprises the element copper.

15. The method of claim 10, wherein the first portion of the second metal layer is further formed directly on a portion of the surface.

16. The method of claim 10, wherein the first portion of the second metal layer is formed directly on the at least one portion of the first metal layer.

17. The method of claim 10, wherein the second portion of the second metal layer is thicker than the first metal layer in a direction perpendicular to the surface.

* * * * *